(12) United States Patent
Park et al.

(10) Patent No.: US 11,532,266 B2
(45) Date of Patent: Dec. 20, 2022

(54) DISPLAY PANEL

(71) Applicant: Samsung Display Co., Ltd., Yongin-si (KR)

(72) Inventors: Hyunae Park, Hwaseong-si (KR); Wonkyu Kwak, Seongnam-si (KR); Seunghan Jo, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/582,398

(22) Filed: Jan. 24, 2022

(65) Prior Publication Data

US 2022/0375399 A1   Nov. 24, 2022

(30) Foreign Application Priority Data

May 20, 2021   (KR) ........................ 10-2021-0064998

(51) Int. Cl.
*G09G 3/32*   (2016.01)

(52) U.S. Cl.
CPC ....... *G09G 3/32* (2013.01); *G09G 2300/0426* (2013.01); *G09G 2330/028* (2013.01)

(58) Field of Classification Search
CPC ............. G09G 3/32; G09G 2300/0426; G09G 2330/028
See application file for complete search history.

(56) References Cited

U.S. PATENT DOCUMENTS

| 10,607,542 | B2  | 3/2020  | Zhu et al. |              |
|------------|-----|---------|------------|--------------|
| 2015/0243231 | A1* | 8/2015 | Yokozeki   | H01L 27/1255 |
|            |     |         |            | 345/694      |
| 2016/0210896 | A1* | 7/2016 | Gil        | H01L 27/3265 |
| 2018/0114823 | A1* | 4/2018 | Lee        | H01L 27/3276 |
| 2018/0145123 | A1* | 5/2018 | Kim        | G09G 3/32    |
| 2020/0212132 | A1* | 7/2020 | Kim        | H01L 27/3258 |

FOREIGN PATENT DOCUMENTS

| KR | 1020170050369 A | 5/2017  |
|----|-----------------|---------|
| KR | 1020180128545 A | 12/2018 |
| KR | 102096051 B1    | 4/2020  |
| KR | 1020210017493 A | 2/2021  |

* cited by examiner

*Primary Examiner* — Andrew Sasinowski
(74) *Attorney, Agent, or Firm* — Cantor Colburn LLP

(57) ABSTRACT

A display device may include a substrate, a first sub-pixel circuit, a second sub-pixel circuit positioned in a first direction from the first sub-pixel circuit, a first driving voltage line extending in a second direction crossing the first direction and which transmits a driving voltage to the first sub-pixel circuit, a second driving voltage line extending in the second direction and which transmits the driving voltage to the second sub-pixel circuit, a first anode electrode including a first contact portion electrically connected to the first sub-pixel circuit, and a second anode electrode including a second contact portion electrically connected to the second sub-pixel circuit. The first contact portion is positioned in a third direction opposite to the first direction from the first driving voltage line. The second contact portion is positioned in the first direction from the second driving voltage line.

20 Claims, 33 Drawing Sheets

DISPLAY PANEL

This application claims priority to Korean Patent Application No. 10-2021-0064998, filed on May 20, 2021, and all the benefits accruing therefrom under 35 U.S.C. § 119, the content of which in its entirety is herein incorporated by reference.

BACKGROUND

1. Field

Embodiments of the invention relate to a display device and method of manufacturing the display device. More particularly, embodiments of the invention relate to a tiled display device and method of manufacturing the tiled display device.

2. Description of the Related Art

Flat panel display devices are widely used in various filed as display devices due to desired characteristics thereof, such as lightweight and thin characteristics. Such flat panel display devices may include liquid crystal display devices and organic light emitting element display devices.

The display device may include a plurality of unit pixels for displaying an image. Each unit pixel may include a plurality of sub-pixels that emits light of different colors. For example, each unit pixel may include three sub-pixels that respectively emit red, green, and blue lights. In such a display device, due to a difference in lifetime of light emitting elements that emit light of different colors, the sub-pixels may be formed to include anode electrodes having different sizes.

SUMMARY

Embodiments of the invention provide a display device with improved display quality.

An embodiment of a display device according to the invention includes a substrate, a first sub-pixel circuit disposed on the substrate, a second sub-pixel circuit disposed on the substrate and positioned in a first direction from the first sub-pixel circuit, a first driving voltage line disposed on the substrate and extending in a second direction crossing the first direction, where the first driving voltage line transmits a driving voltage to the first sub-pixel circuit, a second driving voltage line disposed on the substrate and extending in the second direction, where the second driving voltage line transmits the driving voltage to the second sub-pixel circuit, a first anode electrode disposed on the substrate and including a first contact portion electrically connected to the first sub-pixel circuit, and a second anode electrode disposed on the substrate and including a second contact portion electrically connected to the second sub-pixel circuit. In such an embodiment, the first contact portion is positioned in a third direction opposite to the first direction from the first driving voltage line, and the second contact portion may be positioned in the first direction from the second driving voltage line.

In an embodiment, the second anode electrode may be spaced apart from the first anode electrode in the first direction.

In an embodiment, an area of the first anode electrode may be greater than an area of the second anode electrode.

In an embodiment, the second contact portion may be adjacent to the first anode electrode.

In an embodiment, a distance between the first contact portion and the second contact portion in the first direction may be greater than a distance between the first driving voltage line and the second driving voltage line in the first direction.

In an embodiment, the first sub-pixel circuit may include a first driving transistor which receives the driving voltage from the first driving voltage line, and a first emission control transistor electrically connected to the first driving transistor and the first anode electrode. In such an embodiment, the second sub-pixel circuit may include a second driving transistor which receives the driving voltage from the second driving voltage line, and a second emission control transistor electrically connected to the second driving transistor and the second anode electrode. In such an embodiment, the display panel may further include a first active pattern disposed on the substrate and including a channel portion of the first emission control transistor, and a second active pattern disposed in a same layer as the first active pattern, positioned in the first direction from the first active pattern, and including a channel portion of the second emission control transistor. In such an embodiment, the channel portion of the first emission control transistor may be positioned in the third direction from the first driving voltage line, and the channel portion of the second emission control transistor may positioned in the third direction from the second driving voltage line.

In an embodiment, the display panel may further include a first lower contact pattern disposed between the first active pattern and the first anode electrode, electrically connecting the first active pattern and the first contact portion to each other, and positioned in the third direction from the first driving voltage line, and a second lower contact pattern disposed in a same layer as the first lower contact pattern, electrically connecting the second active pattern and the second contact portion to each other, and overlapping the second driving voltage line.

In an embodiment, the second lower contact pattern may include a first end portion positioned in the third direction from the second driving voltage line and electrically connected to the second active pattern, a second end portion positioned in the first direction from the second driving voltage line and electrically connected to the second contact portion, and a connection portion connecting the first end portion and the second end portion to each other and overlapping the second driving voltage line.

In an embodiment, the display panel may further include a first upper contact pattern disposed between the first lower contact pattern and the first anode electrode, electrically connecting the first lower contact pattern and the first contact portion to each other, and positioned in the third direction from the first driving voltage line, and a second upper contact pattern disposed in a same layer as the first upper contact pattern, electrically connecting the second lower contact pattern and the second contact portion to each other, and positioned in the first direction from the second driving voltage line.

In an embodiment, the second active pattern may include a first portion positioned in the third direction from the second driving voltage line and adjacent to the channel portion of the second emission control transistor, a second portion positioned in the first direction from the second driving voltage line and electrically connected to the second contact portion, and a connection portion connecting the first portion and the second portion and overlapping the second driving voltage line.

In an embodiment, the display panel may further include a first contact pattern disposed between the first active pattern and the first anode electrode, electrically connecting the first active pattern and the first contact portion to each other, and positioned in the third direction from the first driving voltage line, and a second contact pattern disposed in a same layer as the first contact pattern, electrically connecting the second active pattern and the second contact portion to each other, and positioned in the first direction from the second driving voltage line.

In an embodiment, the display panel may further include a third sub-pixel circuit disposed on the substrate and positioned in the first direction from the second sub-pixel circuit, a third driving voltage line disposed on the substrate and extending in the second direction, where the third driving voltage line may transmit the driving voltage to the third sub-pixel circuit, and a third anode electrode disposed on the substrate and including a third contact portion electrically connected to the third sub-pixel circuit, where the third contact portion may be positioned in the third direction from the third driving voltage line.

In an embodiment, a first light emitting element including the first anode electrode, a second light emitting element including the second anode electrode, and a third light emitting element including the third anode electrode may respectively emit light of different colors.

In an embodiment, the first anode electrode may be spaced apart from the third anode electrode in the third direction, and the second anode electrode is spaced apart from the third anode electrode in the second direction.

In an embodiment, an area of the first anode electrode may be greater than each of an area of the second anode electrode and an area of the third anode electrode.

In an embodiment, a distance between the first contact portion and the second contact portion in the first direction may be greater than a distance between the second contact portion and the third contact portion in the first direction.

An embodiment of a display device according to the invention includes a substrate including a first area and a second area positioned in a first direction from the first area, a first sub-pixel circuit disposed in the first area on the substrate, a second sub-pixel circuit disposed in the second area on the substrate, a first anode electrode disposed on the substrate and including a first contact portion electrically connected to the first sub-pixel circuit, and a second anode electrode disposed on the substrate and including a second contact portion electrically connected to the second sub-pixel circuit. In such an embodiment, a first imaginary central line extending in a second direction perpendicular to the first direction through a center of the first area mis defined, and the first contact portion is positioned in a third direction opposite to the first direction from the first imaginary central line. In such an embodiment, a second imaginary central line extending in the second direction through a center of the second area is defined, and the second contact portion is positioned in the first direction from the second imaginary central line.

In an embodiment, an area of the first anode electrode may be greater than an area of the second anode electrode.

In an embodiment, a distance between the first contact portion and the second contact portion in the first direction may be greater than a distance between the first imaginary central line and the second imaginary central line in the first direction.

In an embodiment, the substrate may further include a third area positioned in the first direction from the second area. In such an embodiment, the display panel may further include a third sub-pixel circuit disposed in the third area on the substrate and a third anode electrode disposed on the substrate and including a third contact portion electrically connected to the third sub-pixel circuit. In such an embodiment, a third imaginary central line extending in the second direction through a center of the third area may be defined, and the third contact portion may be positioned in the third direction from the third imaginary central line.

In embodiments of the invention, a unit pixel included in the display device may include sub-pixels which emit light of different colors. Each of the sub-pixels may include the sub-pixel circuit and the light emitting element. The anode electrode of the light emitting element may include the contact portion electrically connected to the sub-pixel circuit through an contact hole. A position of the contact portion relative to corresponding sub-pixel circuit may be different for each of the sub-pixels emitting light of different colors. Accordingly, even if the anode electrodes of the light emitting elements have different areas, the sub-pixel circuits may be relatively uniformly disposed, such that an image quality characteristic of the unit pixel may be improved, and a display quality of the display device may be improved.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
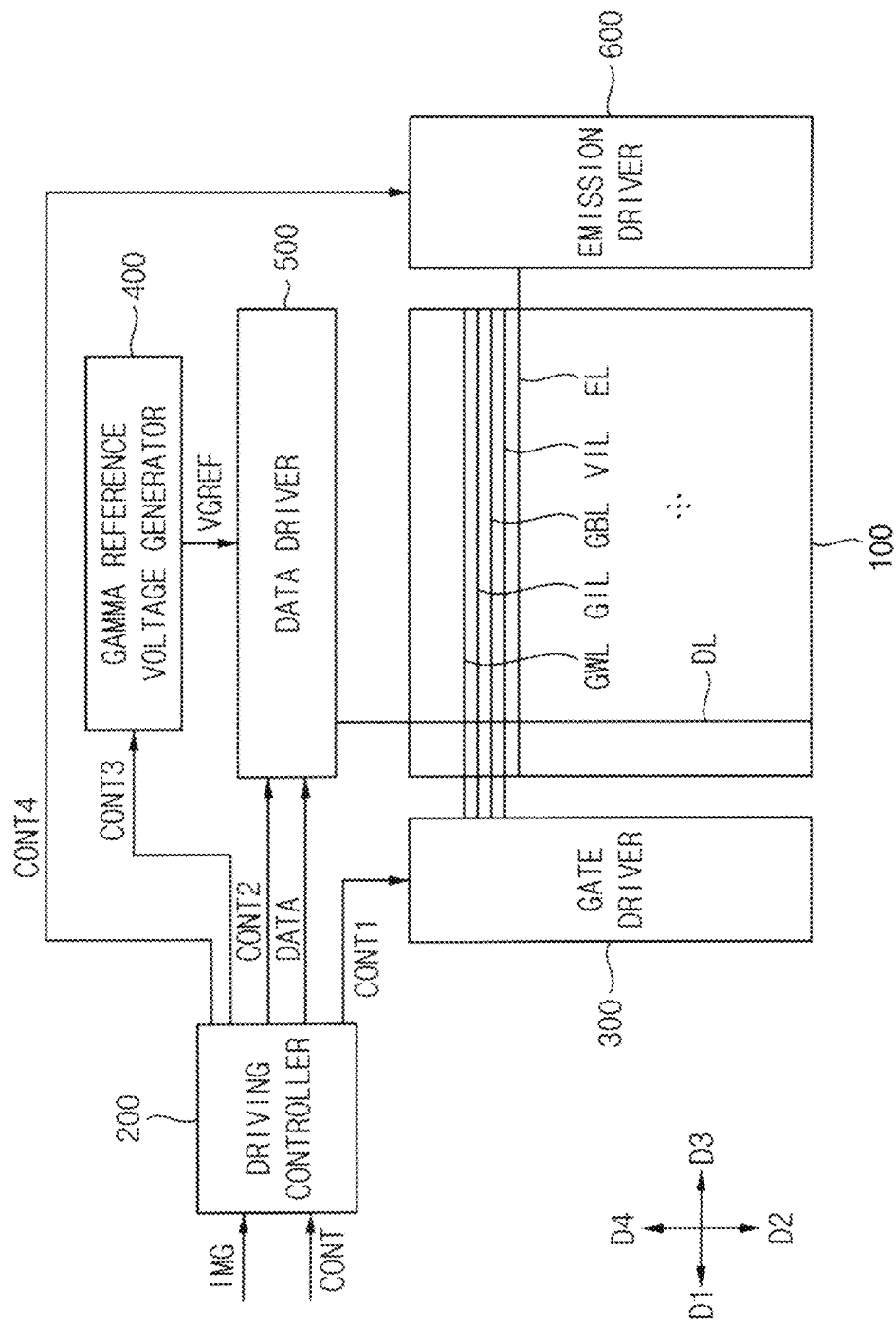
FIG. 1 is a block diagram illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein.

Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with the accompanying drawings.

FIG. 1 is a block diagram illustrating a display device according to an embodiment.

Referring to FIG. 1, an embodiment of a display device may include a display panel 100 and a panel driver. The panel driver may include a driving controller 200 (e.g., a control circuit), a gate driver 300 (e.g., a driving circuit), a gamma reference voltage generator 400, a data driver 500 (e.g., a driving circuit), and an emission driver 600 (e.g., a driving circuit).

The display panel 100 may include a display area on which an image is displayed and a peripheral area adjacent to the display area.

The display panel 100 may include a plurality of gate lines GWL, GIL, and GBL, a plurality of data lines DL, a plurality of emission control lines EL, and a plurality of pixels. The pixels may be electrically connected to each of the gate lines GWL, GIL, and GBL, the data lines DL, and the emission control lines EL. In one embodiment, for example, each of the gate lines GWL, GIL, and GBL and the emission control lines EL may extend in a first direction D1. In such an embodiment, each of the data lines DL may extend in a second direction D2 crossing the first direction D1.

In an embodiment, the display panel 100 may further include a plurality of initialization voltage lines VIL for transmitting an initialization voltage to one or more of the pixels. In one embodiment, for example, each of the initialization voltage lines VIL may extend in the first direction D1.

The driving controller 200 may receive an input image data IMG and an input control signal CONT from an external apparatus (not illustrated). In one embodiment, for example, the input image data IMG may include red image data, green image data, and blue image data. The input image data IMG may further include white image data. Alternatively, the input image data IMG may include magenta image data, cyan image data, and yellow image data. The input control signal CONT may include a master clock signal and a data enable signal. The input control signal CONT may further include a vertical synchronizing signal and a horizontal synchronizing signal.

The driving controller 200 may generate a first control signal CONT1, a second control signal CONT2, a third control signal CONT3, a fourth control signal CONT4, and a data signal DATA based on the input image data IMG and the input control signal CONT.

The driving controller 200 may generate the first control signal CONT1 for controlling an operation of the gate driver 300 based on the input control signal CONT. The driving controller 200 may output the first control signal CONT1 to the gate driver 300. The first control signal CONT1 may include a vertical start signal and a gate clock signal.

The driving controller 200 may generate the second control signal CONT2 for controlling an operation of the data driver 500 based on the input control signal CONT. The driving controller 200 may output the second control signal CONT2 to the data driver 500. The second control signal CONT2 may include a horizontal start signal and a load signal.

The driving controller 200 may generate the data signal DATA based on the input image data IMG. The driving controller 200 may output the data signal DATA to the data driver 500.

The driving controller 200 may generate the third control signal CONT3 for controlling an operation of the gamma reference voltage generator 400 based on the input control signal CONT. The driving controller 200 may output the third control signal COTN3 to the gamma reference voltage generator 400.

The driving controller 200 may generate the fourth control signal CONT4 for controlling an operation of the emission driver 600 based on the input control signal CONT. The driving controller 200 may output the fourth control signal CONT4 to the emission driver 600.

The gate driver 300 may generate gate signals in response to the first control signal CONT1 received from the driving controller 200. The gate driver 300 may output the gate signals to the gate lines GWL, GIL, and GBL.

In an embodiment, the gate driver 300 may generate initialization signals in response to the first control signal CONT1 received from the driving controller 200. The gate driver 300 may output the initialization signals to the initialization voltage lines VIL.

The gamma reference voltage generator 400 may generate a gamma reference voltage VGREF in response to the third control signal CONT3 received from the driving controller 200. The gamma reference voltage generator 400 may provide the gamma reference voltage VGREF to the data driver 500. The gamma reference voltage VGREF may have a value corresponding to a level of the data signal DATA.

In one embodiment, for example, the gamma reference voltage generator 400 may be disposed in the driving controller 200, or in the data driver 500.

The data driver 500 may receive the second control signal CONT2 and the data signal DATA from the driving controller 200, and may receive the gamma reference voltage VGREF from the gamma reference voltage generator 400. The data driver 500 may convert the data signal DATA into data voltages having an analog type using the gamma reference voltages VGREF. The data driver 500 may output the data voltages to the data lines DL.

The emission driver 600 may generate emission control signals in response to the fourth control signal CONT4 received from the driving controller 200. The emission driver 600 may output the emission control signals to the emission control lines EL.

Figure 2:
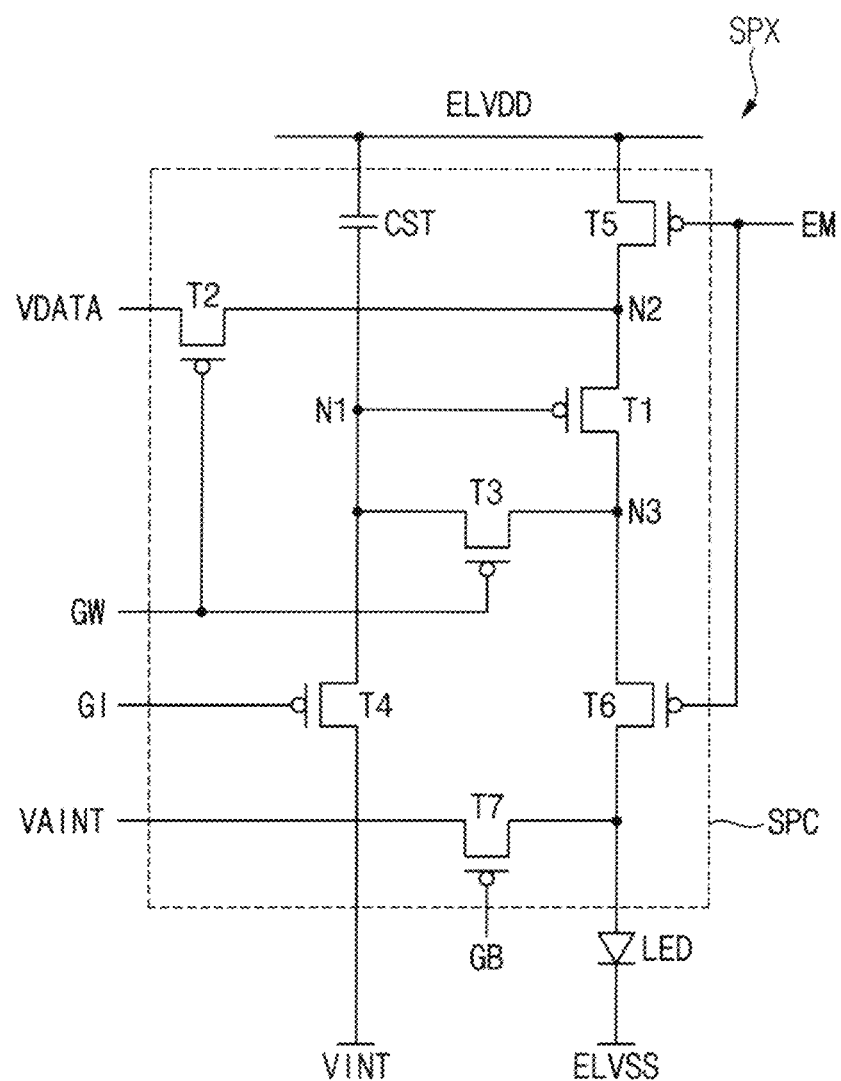
FIG. 2 is a circuit diagram illustrating a sub-pixel included in the display device of FIG. 1.
Figure 3:
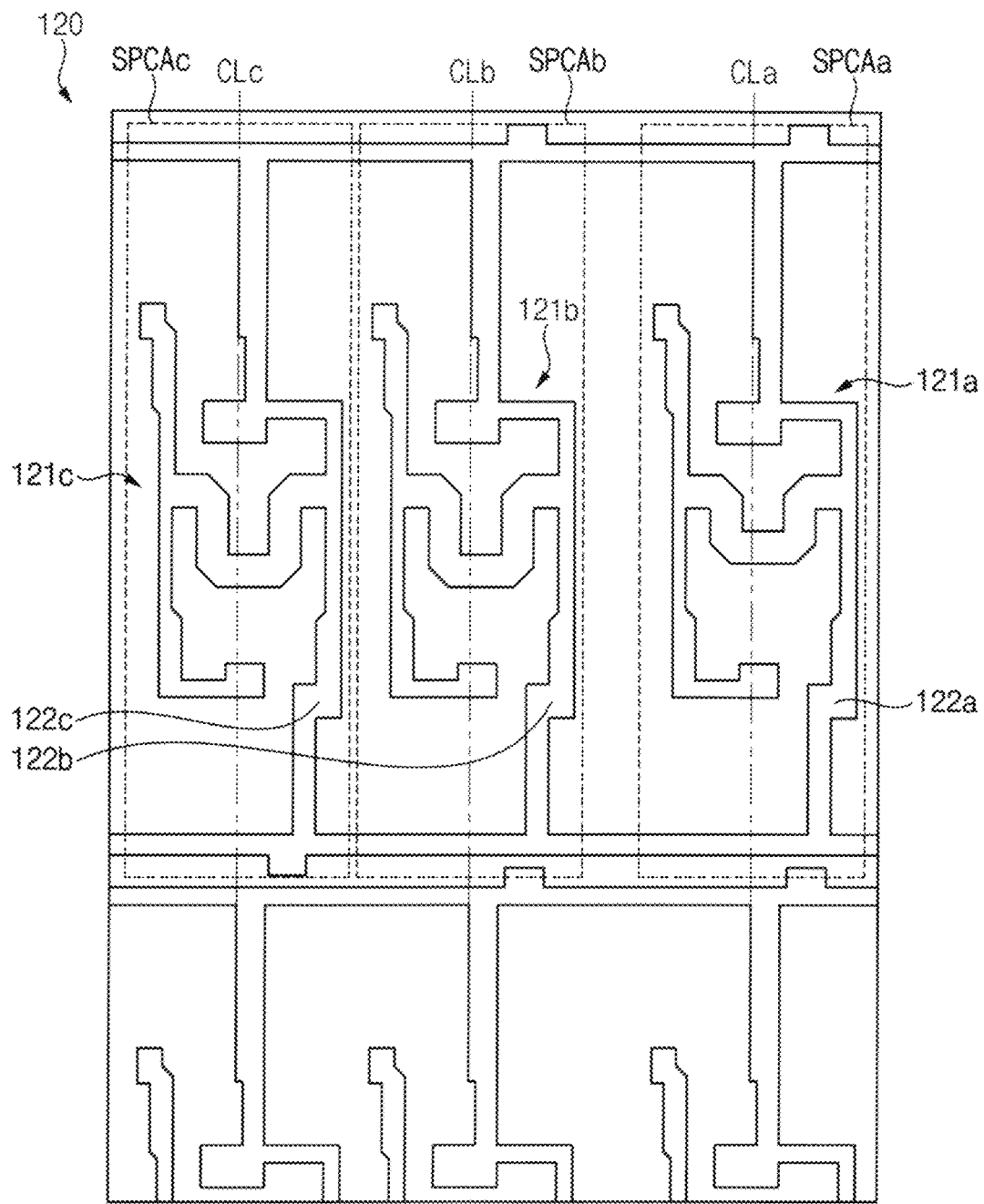
FIGS. 3 to 13 are plan views illustrating layers of a pixel included in the display device of FIG. 1.
Figure 4:
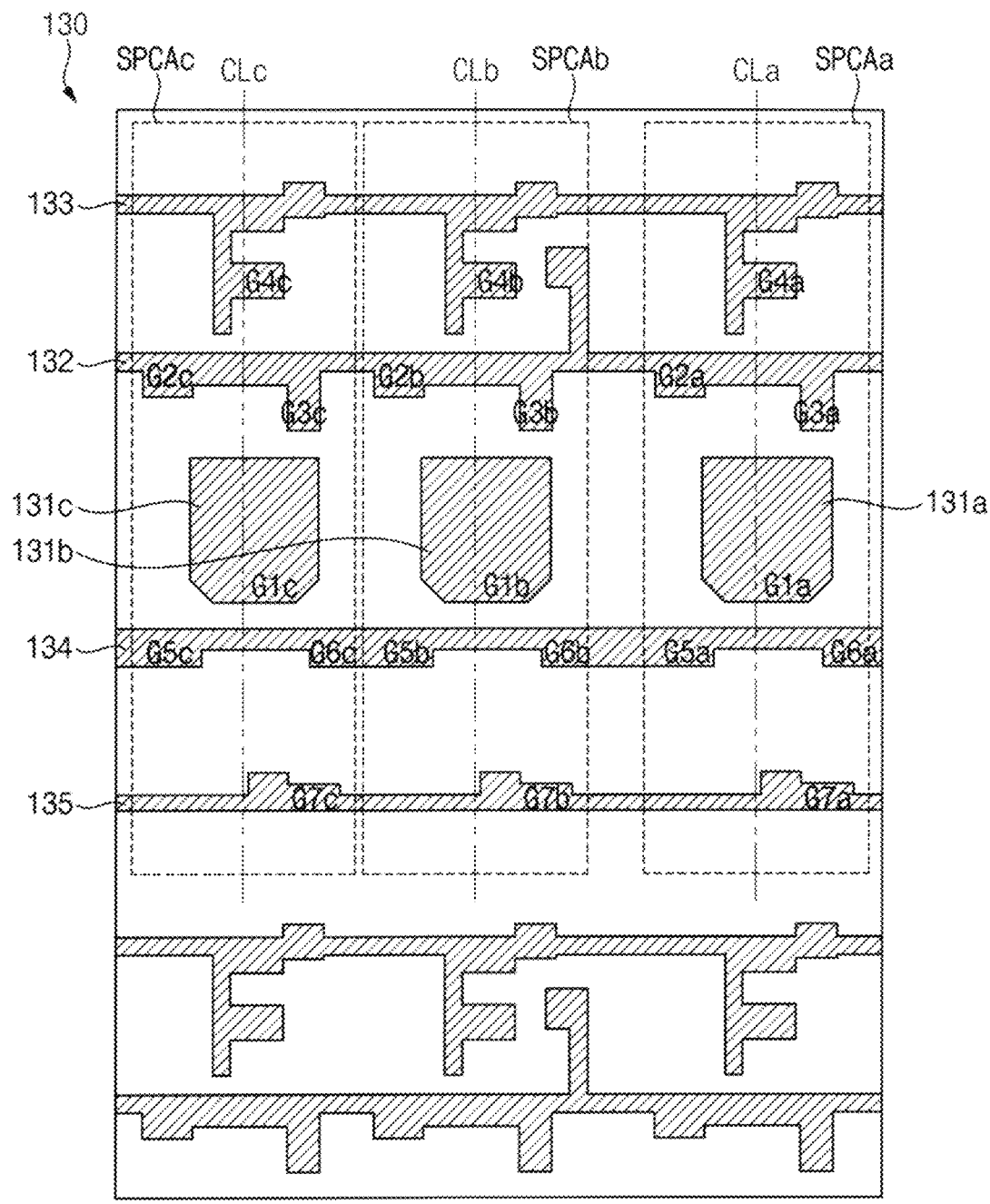
Figure 5:
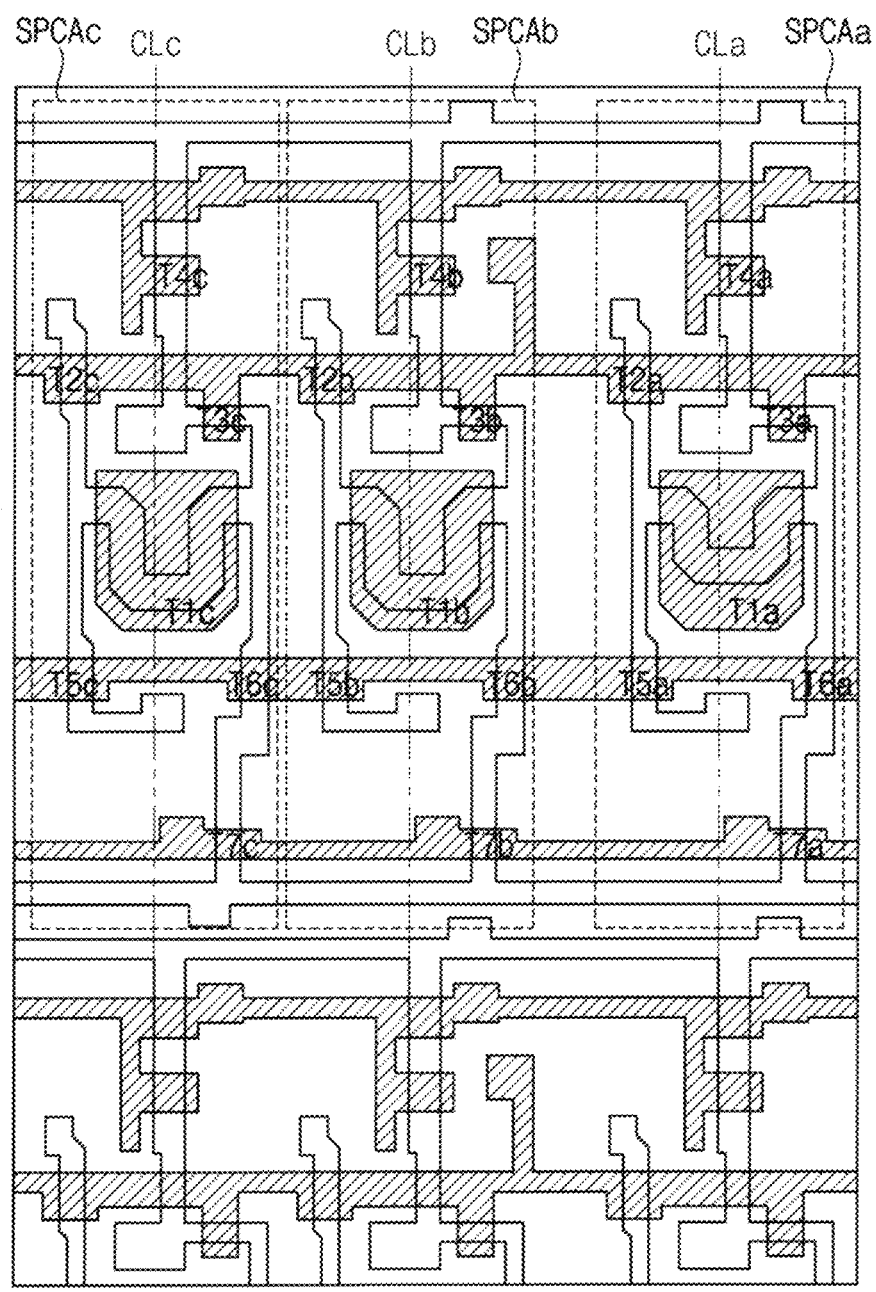
Figure 5:
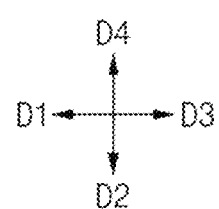
Figure 6:
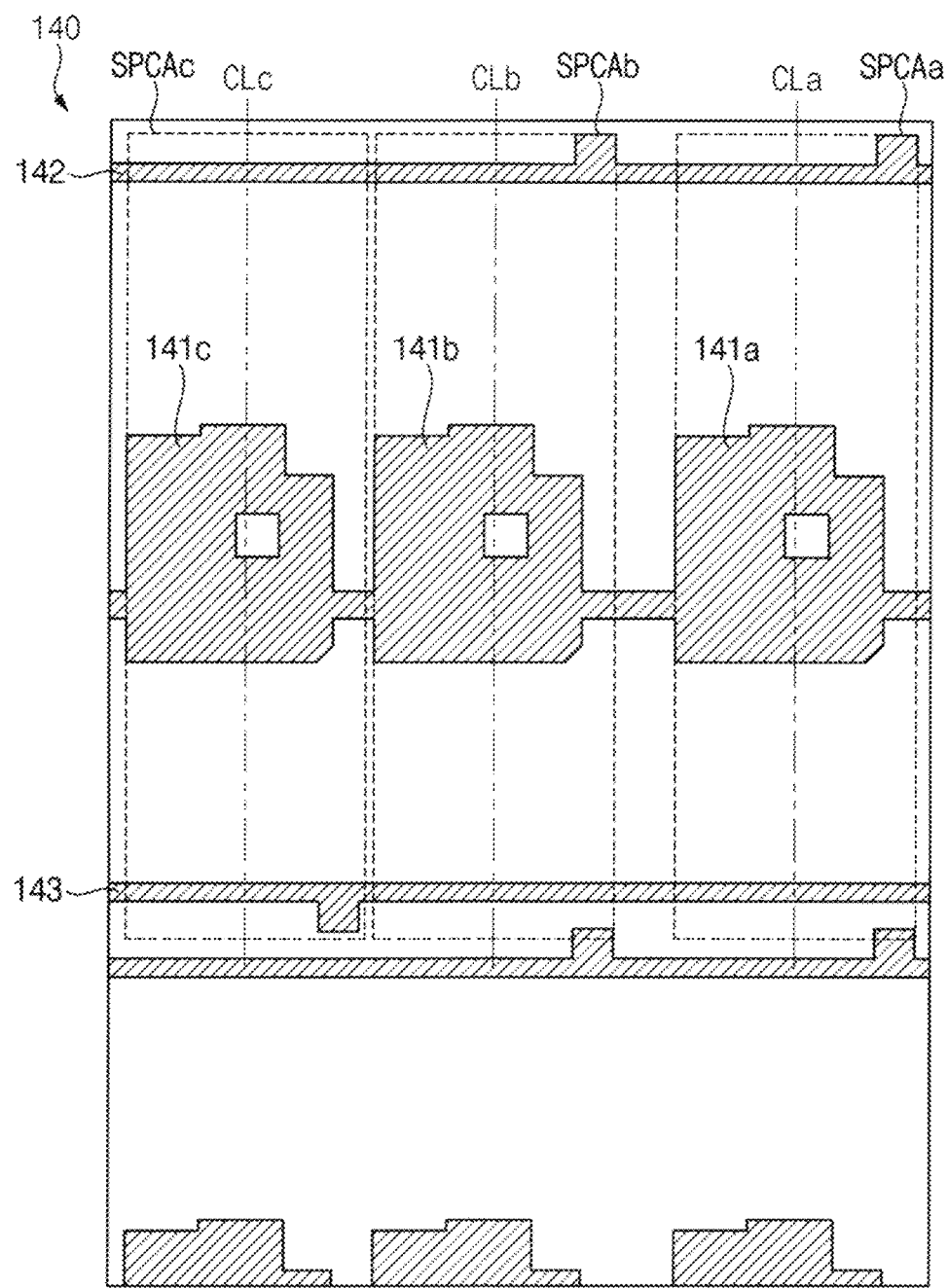

FIG. 2 is a circuit diagram illustrating a sub-pixel included in the display device of FIG. 1.

Referring to FIGS. 1 and 2, each of the pixels (e.g., each of unit pixels) included in the display panel 100 may include a plurality of sub-pixels SPX. In an embodiment, each of the pixels may include first to third sub-pixels that emits light of different colors, respectively. In one embodiment, for example, the first sub-pixel may emit blue light, the second sub-pixel may emit green light, and the third sub-pixel may emit red light, but embodiments are not limited thereto.

Each of the sub-pixels SPX may include a sub-pixel circuit SPC and a light emitting element LED. The sub-pixel circuit SPC may provide a driving current to the light emitting element LED. The light emitting element LED may emit light based on the driving current. The sub-pixel circuit SPC may include at least one transistor and at least one capacitor to generate the driving current.

In an embodiment, as shown in FIG. 2, the sub-pixel circuit SPC may include first to seventh transistors T1 to T7 and a storage capacitor CST, but embodiments are not limited thereto. In an alternative embodiment, the sub-pixel circuit SPC may include 2 to 6 or 8 or more transistors and/or 1 or 3 or more capacitors.

The first transistor T1 may include a gate electrode connected to a first node N1, a first electrode connected to a second node N2, and a second electrode connected to a third node N3. The first transistor T1 may generate the driving current based on a voltage between the first node N1 and the second node N2. The first transistor T1 may be referred to as a driving transistor.

The second transistor T2 may include a gate electrode to which a data write gate signal GW is applied, a first electrode to which the data voltage VDATA is applied, and a second electrode connected to the second node N2. The second transistor T2 may provide the data voltage VDATA to the second node N2 in response to the data write gate signal GW. The second transistor T2 may be referred to as a switching transistor.

The third transistor T3 may include a gate electrode to which the data write gate signal GW is applied, a first electrode connected to the first node N1, and a second electrode connected to the third node N3. The third transistor T3 may compensate a threshold voltage of the first transistor T1 by connecting the first node N1 and the third node N3 in response to the data write gate signal GW. The third transistor T3 may be referred to as a compensation transistor.

The fourth transistor T4 may include a gate electrode to which a data initialization gate signal GI is applied, a first electrode to which a first initialization voltage VINT is applied, and a second electrode connected to the first node N1. The fourth transistor T4 may provide the first initialization voltage VINT to the first node N1 in response to the data initialization gate signal GI. The fourth transistor T4 may be referred to as a first initialization transistor.

The fifth transistor T5 may include a gate electrode to which the emission control signal EM is applied, a first electrode to which a first power voltage ELVDD is applied, and a second electrode connected to the second node N2. The first power voltage ELVDD may be a high supply voltage. The first power voltage ELVDD may be referred to as a driving voltage.

The sixth transistor T6 may include a gate electrode to which the emission control signal EM is applied, a first electrode connected to the third node N3, and a second electrode connected to a first electrode (e.g., an anode electrode) of the light emitting element LED.

The fifth transistor T5 and the sixth transistor T6 may provide the driving current generated by the first transistor T1 to the first electrode of the light emitting element LED in response to the emission control signal EM. The fifth transistor T5 and the sixth transistor T6 may be referred to as emission control transistors.

The seventh transistor T7 may include a gate electrode to which a light emitting element initialization gate signal GB is applied, a first electrode to which a second initialization voltage VAINT is applied, and a second electrode connected to the first electrode of the light emitting element LED. The seventh transistor T7 may provide the second initialization voltage VAINT to the first electrode of the light emitting element LED in response to the light emitting element initialization gate signal GB. The seventh transistor T7 may be referred to as a second initialization transistor.

The storage capacitor CST may include a first electrode to which the first power voltage ELVDD is applied and a second electrode connected to the first node N1.

The light emitting element LED may include the first electrode and a second electrode (e.g., a cathode electrode) to which a second power voltage ELVSS is applied. The second power voltage ELVSS may be a low power voltage. The second power voltage ELVSS may be referred to as a common voltage. The light emitting element LED may emit light based on the driving current provided from the sub-pixel circuit SPC.

In an embodiment, the first sub-pixel may include a first sub-pixel circuit and a first light emitting element, the second sub-pixel may include a second sub-pixel circuit and a second light emitting element, and the third sub-pixel may include a third sub-pixel circuit and a third light emitting element. The first to third light emitting elements may emit light of different colors, respectively. In one embodiment, for example, the first light emitting element may emit blue light, the second light emitting element may emit green light, and the third light emitting element may emit red light, but embodiments are not limited thereto.

Figure 14:
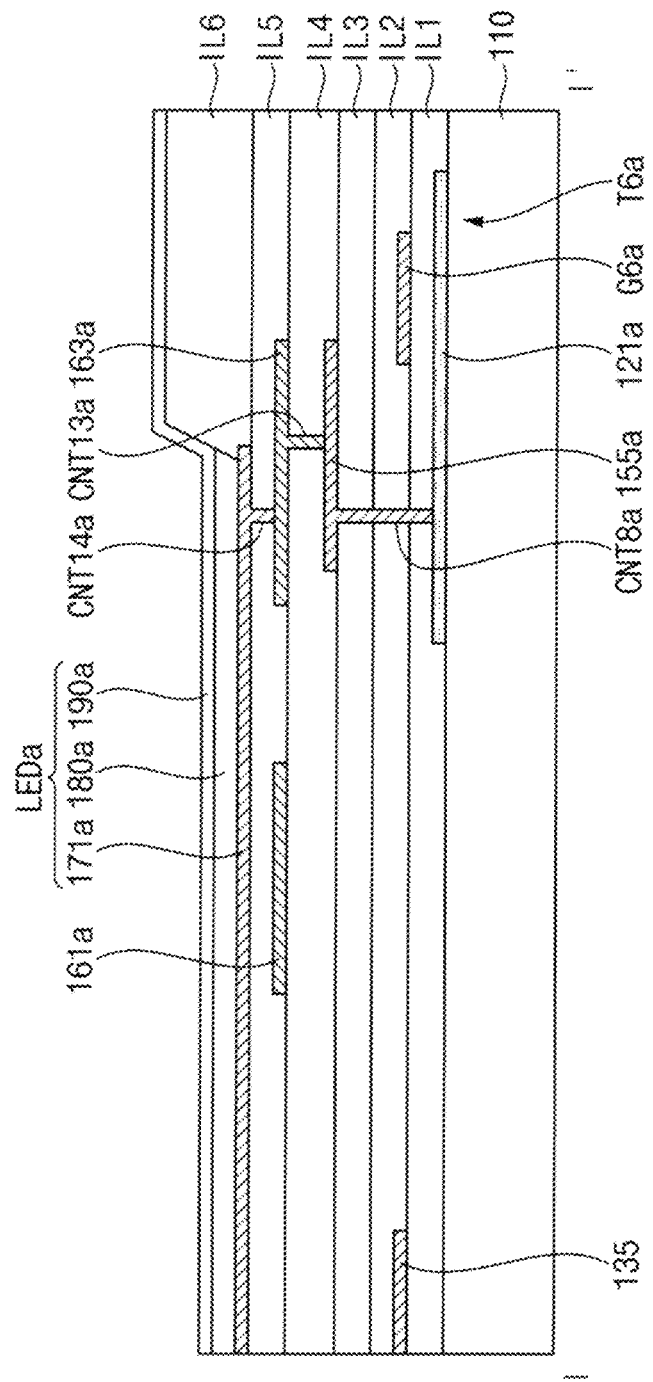
FIG. 14 is a cross-sectional view taken along line I-I' of FIG. 13.
Figure 15:
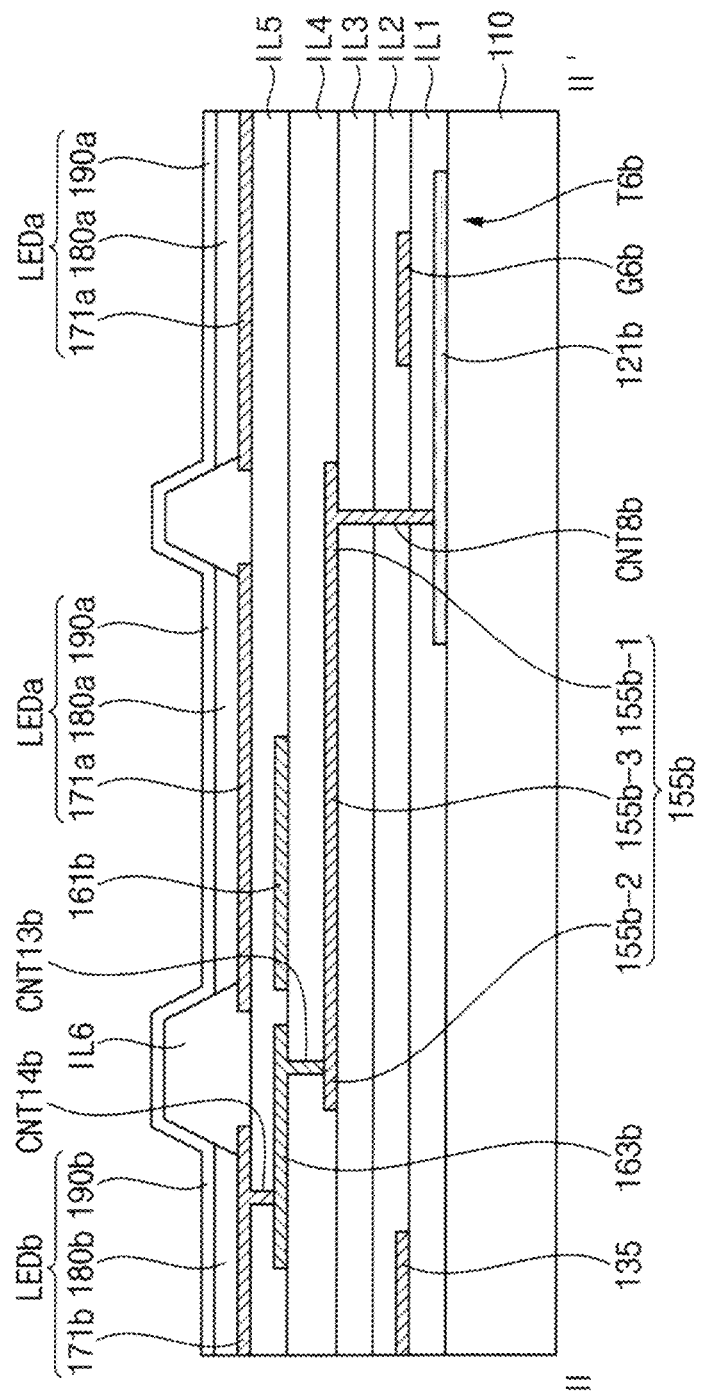
FIG. 15 is a cross-sectional view taken along line II-II' of FIG. 13.
Figure 16:
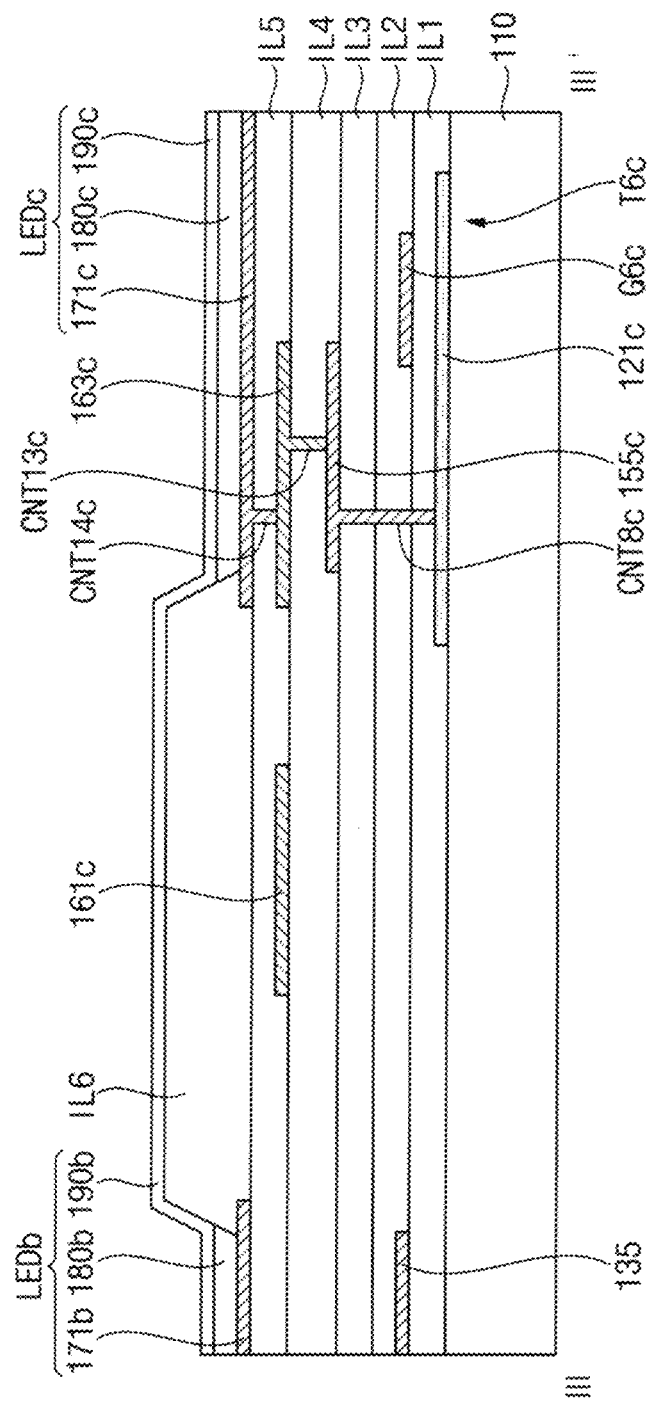
FIG. 16 is a cross-sectional view taken along line III-III' of FIG. 13.
Figure 17:
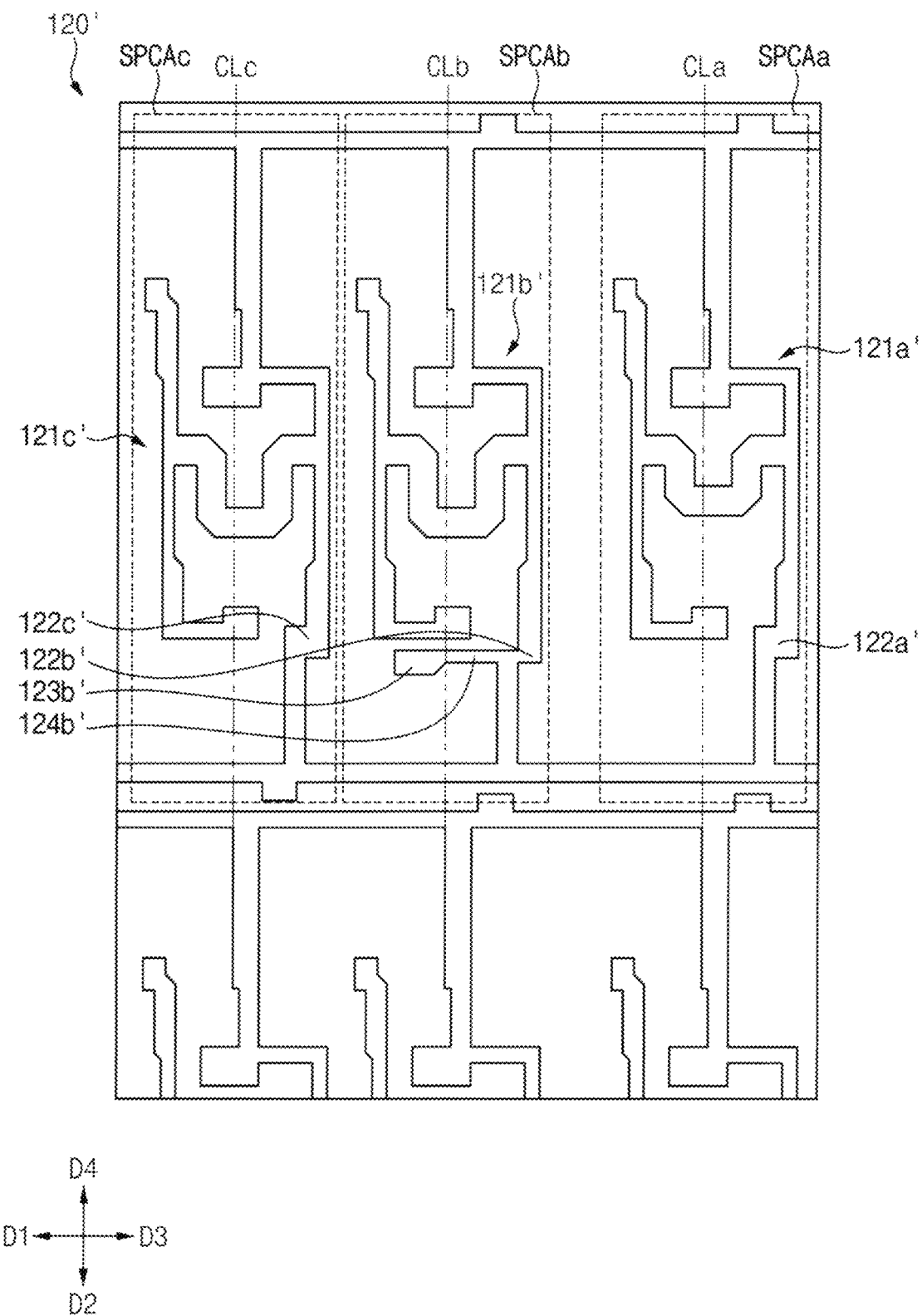
FIGS. 17 to 23 are plan views illustrating layers of a pixel included in a display device according to an alternative embodiment.
Figure 18:
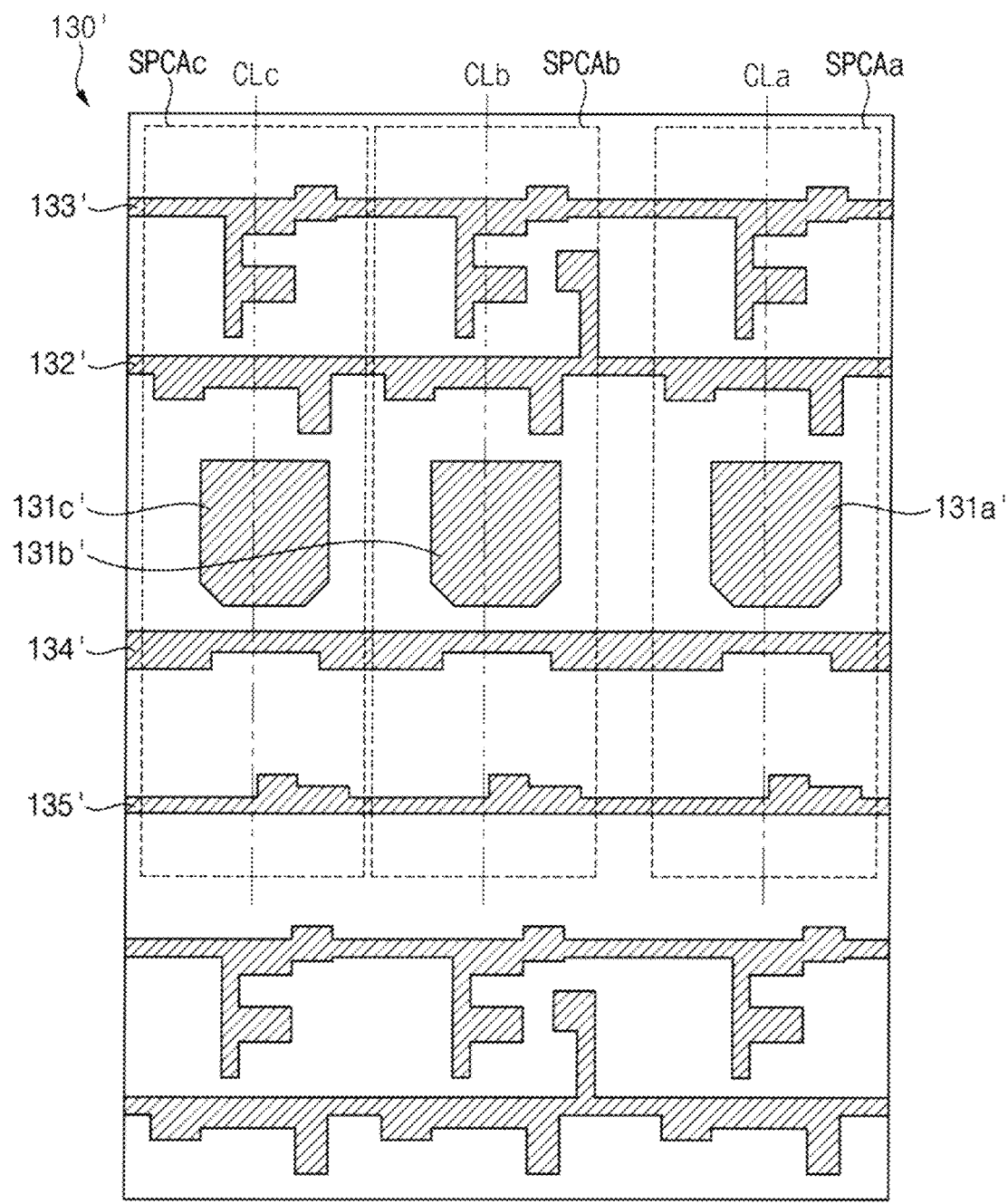
Figure 18:
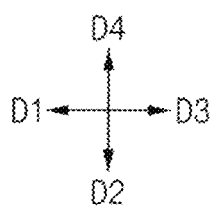
Figure 19:
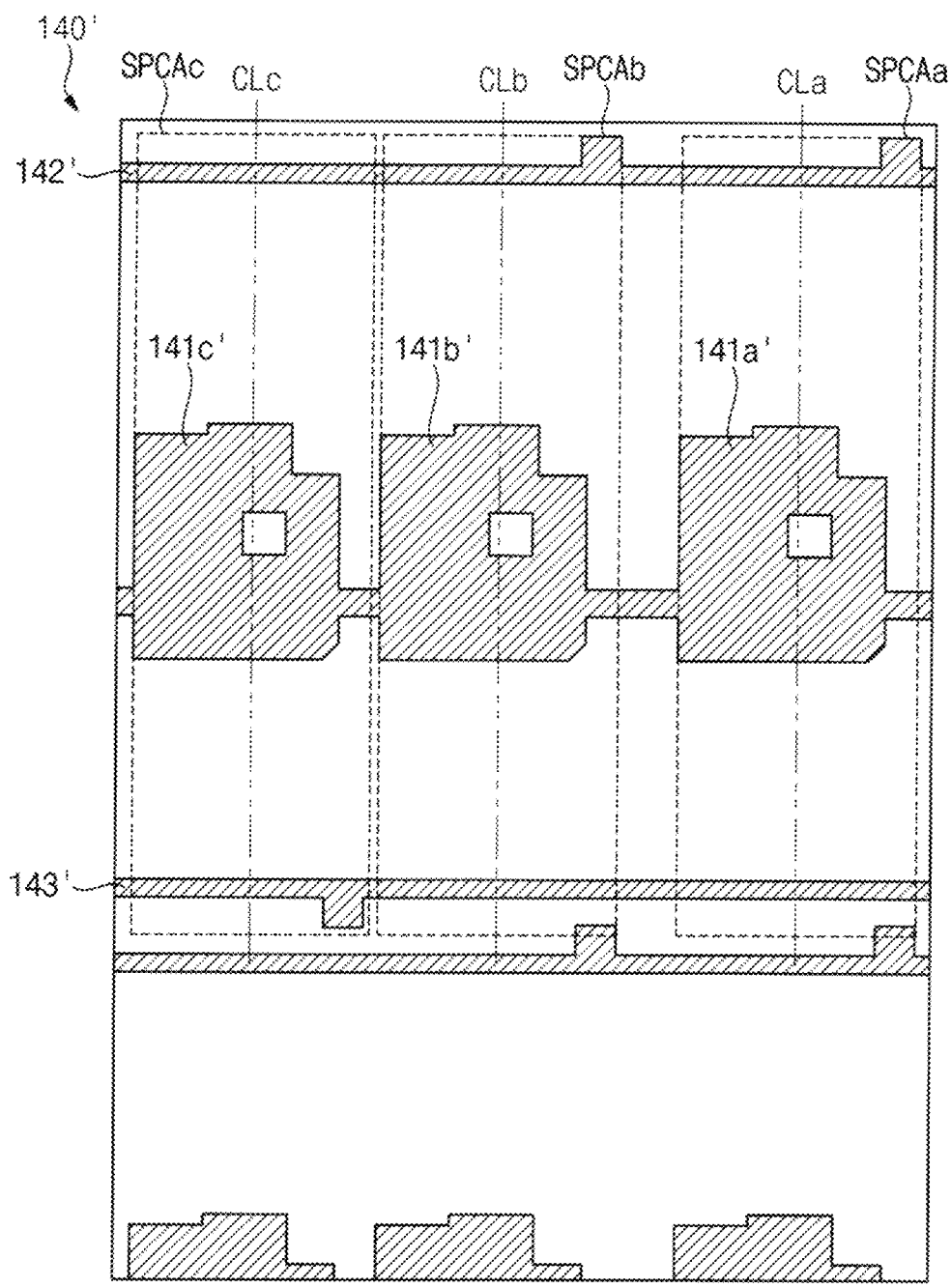
Figure 20:
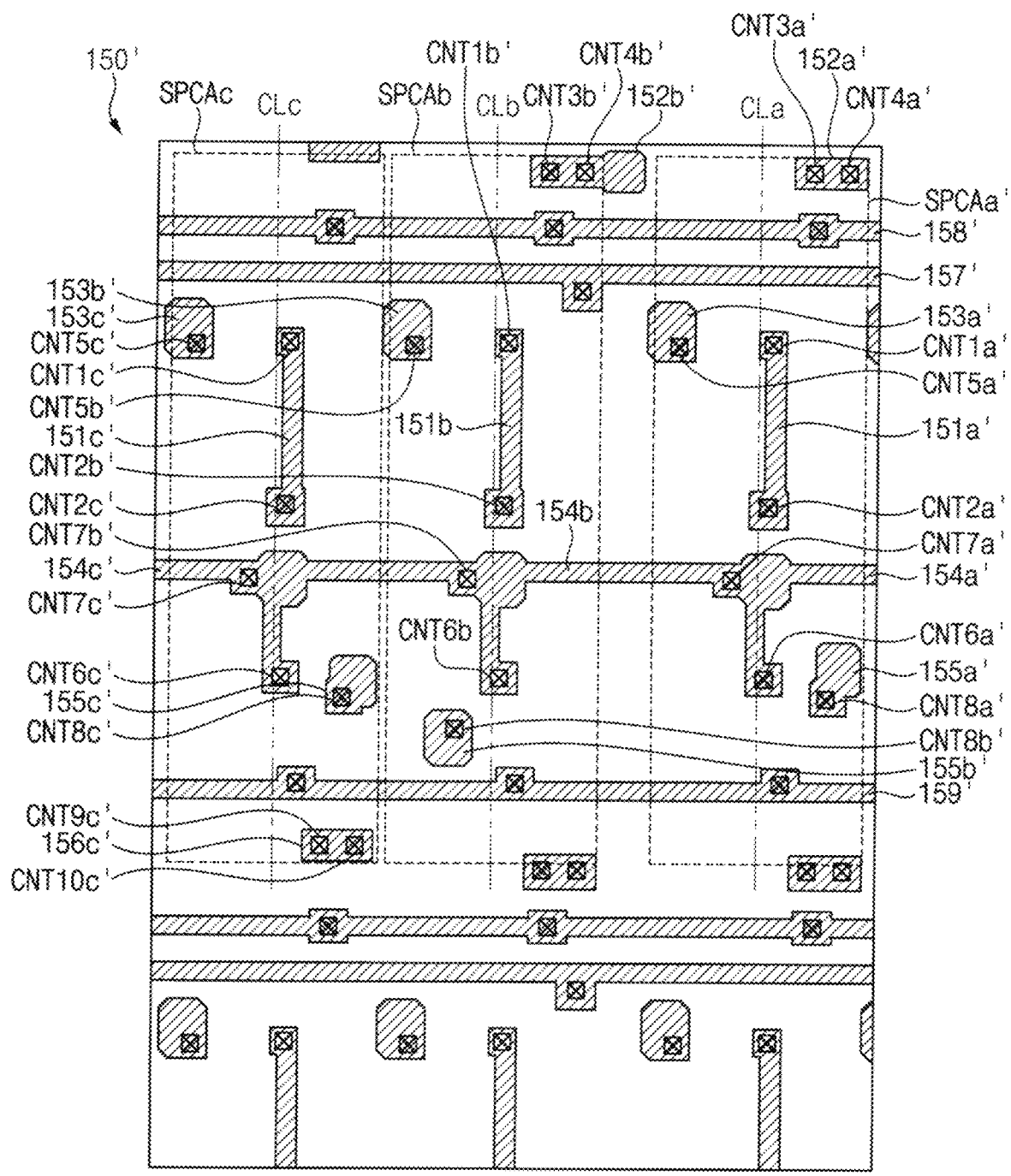
Figure 20:
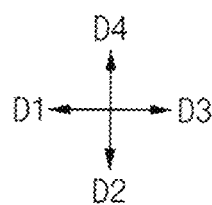
Figure 21:
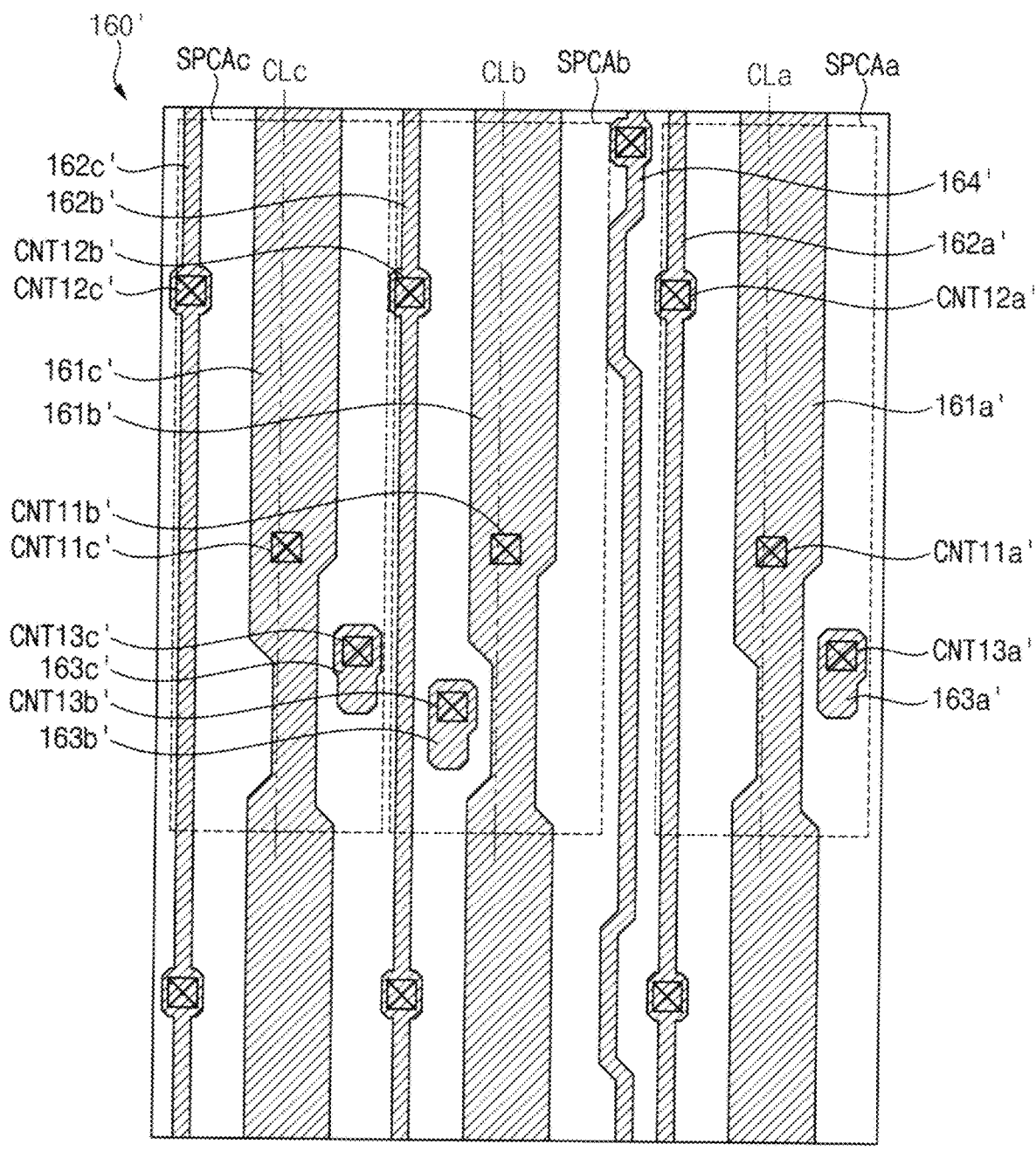
Figure 21:
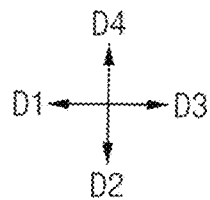
Figure 22:
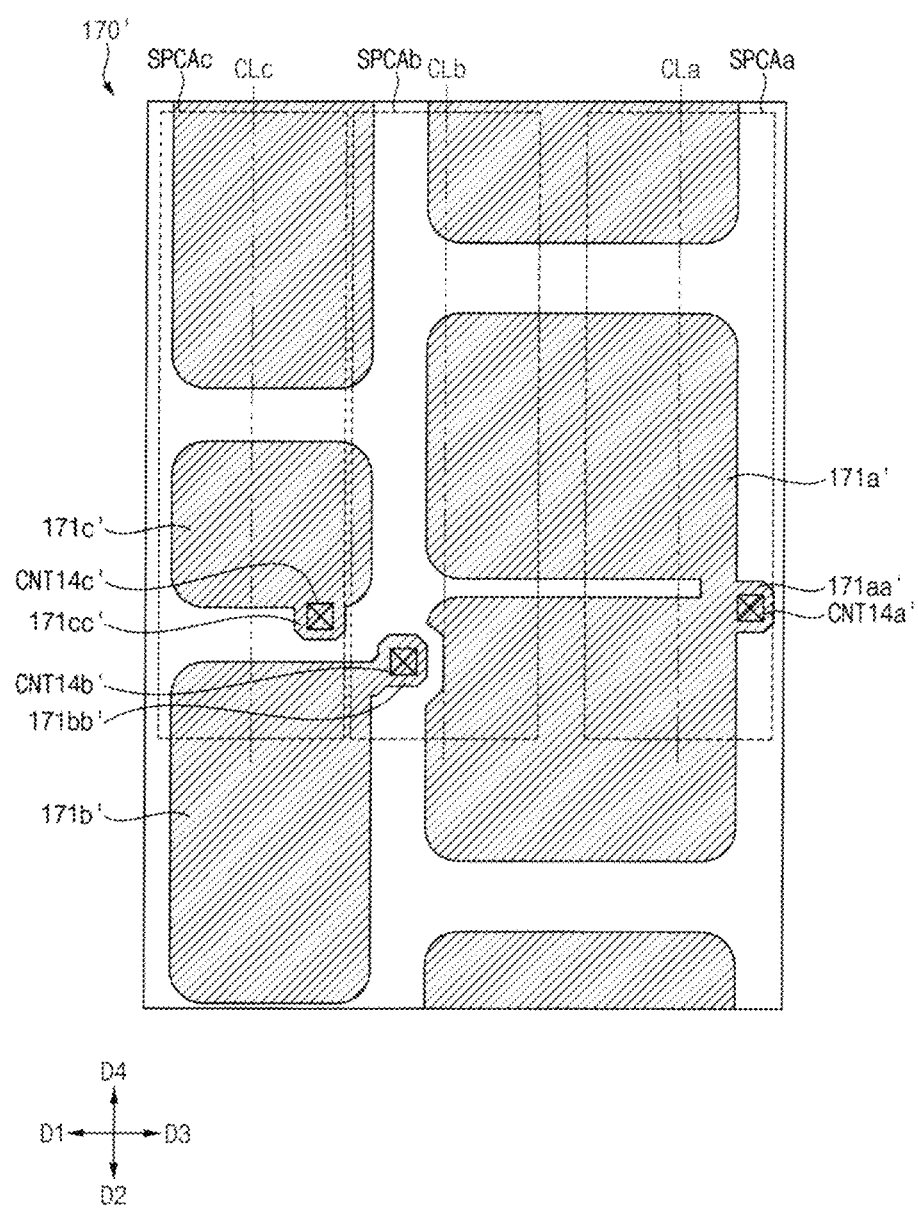
Figure 23:
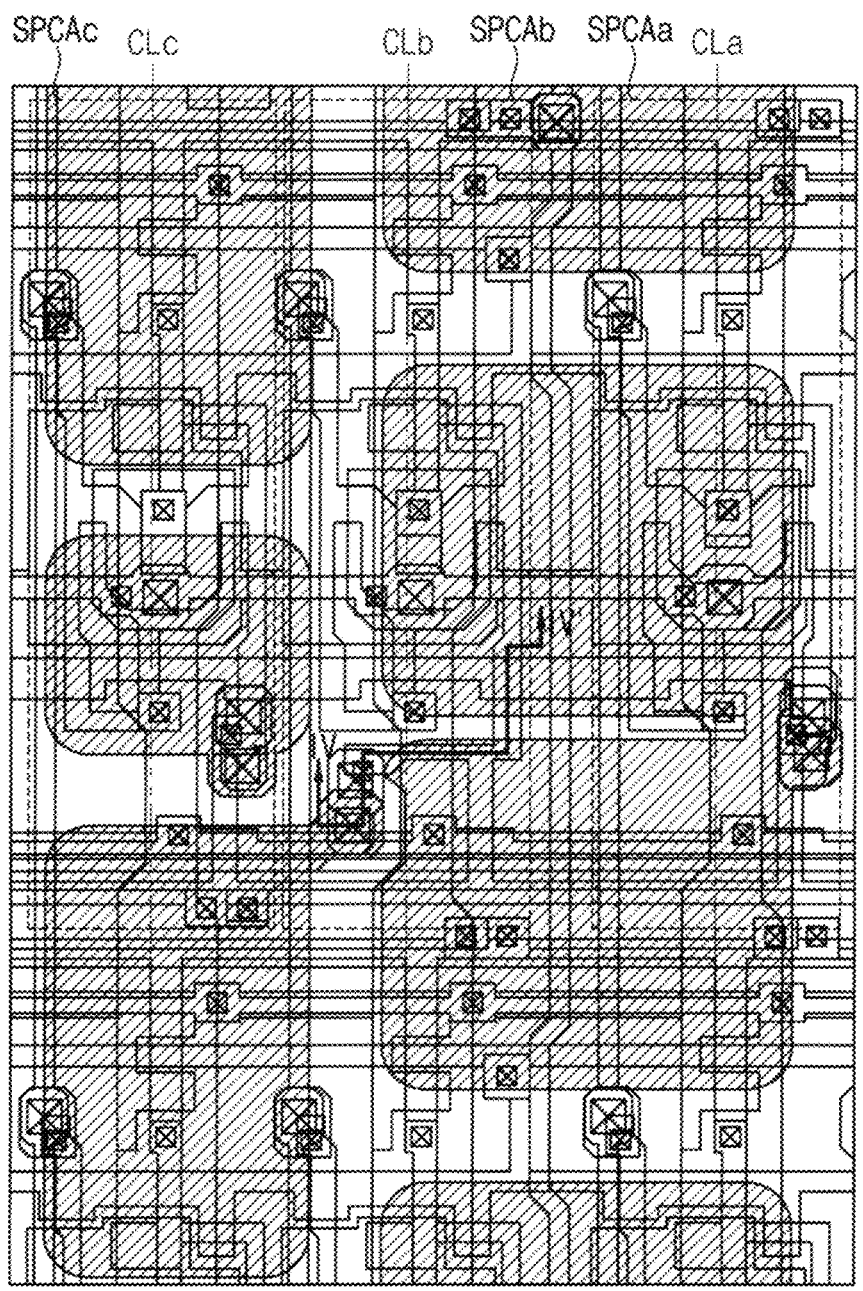
Figure 23:
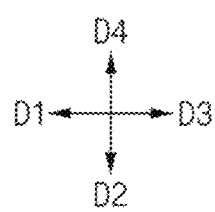

FIGS. 3 to 13 are plan views illustrating layers of a pixel included in the display device of FIG. 1. FIG. 14 is a cross-sectional view taken along line I-I' of FIG. 13. FIG. 15 is a cross-sectional view taken along line II-II' of FIG. 13. FIG. 16 is a cross-sectional view taken along line III-III' of FIG. 13.

Referring to FIGS. 1 to 16, in an embodiment, each of the pixels included in the display panel 100 may include a substrate 110, an active layer 120, a first conductive layer 130, a second conductive layer 140, a third conductive layer 150, a fourth conductive layer 160, a fifth conductive layer 170, emission layers 180a, 180b, and 180c, and a sixth conductive layer.

The substrate 110 may include a plurality of pixel circuit areas. In one embodiment, for example, the pixel circuit areas may be arranged in a matrix form in a plan view. Each of the pixel circuit areas may include first to third sub-pixel circuit areas SPCAa, SPCAb, and SPCAc. In one embodiment, for example, the first to third sub-pixel circuit areas SPCAa, SPCAb, and SPCAc may be arranged in the first direction D1. The first to third sub-pixel circuit areas SPCAa, SPCAb, and SPCAc may be respectively referred to as first to third areas.

The first to third sub-pixel circuits SPCa, SPCb, and SPCc may be respectively disposed in the first to third sub-pixel circuit areas SPCAa, SPCAb, and SPCAc. The first to third sub-pixel circuits SPCa, SPCb, and SPCc may be substantially the same as or similar to each other except for third contact patterns 155a, 155b, and 155c and fourth contact patterns 163a, 163b, and 163b to be described later. Therefore, hereinafter, the first sub-pixel circuit SPCa disposed in the first sub-pixel circuit area SPCAa will be mainly described.

The substrate 110 may be an insulating substrate including or formed of a transparent or opaque material. In an embodiment, the substrate 110 may include a glass. In such an embodiment, the display panel 100 may be a rigid display panel. In an alternative embodiment, the substrate 110 may include a plastic. In such an embodiment, the display panel 100 may be a flexible display panel.

The active layer 120 may be disposed on the substrate 110. The active layer 120 may include an oxide semiconductor, a silicon semiconductor, an organic semiconductor, or the like. In one embodiment, for example, the oxide semiconductor may include an oxide of at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like.

In an embodiment, a buffer layer may be disposed between the substrate 110 and the active layer 120. The buffer layer may prevent impurities such as oxygen or moisture from diffusing into the active layer 120 from the substrate 110. In an embodiment, the buffer layer may provide a substantially flat upper surface on the substrate 110. The buffer layer may include an inorganic insulating material such as a silicon compound, a metal oxide, or the like. The inorganic insulating material may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. These can be used alone or in a combination thereof. The buffer layer may have a single-layered structure or a multi-layered structure including a plurality of insulating layers. In an alternative embodiment, the buffer layer may be omitted.

The active layer 120 may include active patterns 121a, 121b, and 121c respectively disposed in the first to third sub-pixel circuit areas SPCAa, SPCAb, and SPCAc. A portion 122a of the active pattern 121a may be (or define) a second electrode of a sixth transistor T6a. As will be described later, the portion 122a of the active pattern 121a or the second electrode of a sixth transistor T6a may be connected to a first electrode 171a of the first light emitting element LEDa through a third contact pattern 155a and a fourth contact pattern 163a.

In an embodiment, the portion 122a of the active pattern 121a may be disposed in a first side portion of the first sub-pixel circuit area SPCAa. The first side portion may be a side portion (e.g., a right portion) in a third direction D3 opposite to the first direction D1 from a first central line CLa. The first central line CLa may be defined as an imaginary line extending in the second direction D2 through a center of the first sub-pixel circuit area SPCAa. The active patterns 121a, 121b, and 121c may have substantially a same shape as or a similar shape to each other.

The active pattern 121a disposed in the first sub-pixel circuit area SPCAa may be referred to as a first active pattern. The active pattern 121b disposed in the second sub-pixel circuit area SPCAb may be referred to as a second active pattern. The active pattern 121c disposed in the third sub-pixel circuit area SPCAc may be referred to as a third active pattern.

The first conductive layer 130 may be disposed on the active layer 120. The first conductive layer 130 may include a conductive material such as a metal, an alloy, a conductive metal nitride, a conductive metal oxide, a transparent conductive material, or the like. The conductive material may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, alloys containing silver, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide ("ITO"), tin oxide (SnO), indium oxide (InO), gallium oxide (GaO), indium zinc oxide ("IZO"), or the like. These can be used alone or in a combination thereof.

A first insulating layer IL1 may be disposed between the active layer 120 and the first conductive layer 130. The first insulating layer IL1 may include an inorganic insulating material.

The first conductive layer 130 may include first conductive patterns 131a, 131b, and 131c, a data write gate line 132, a data initialization gate line 133, an emission control line 134, and a light emitting element initialization gate line 135.

A portion of the first conductive pattern 131a overlapping the active pattern 121a may be a gate electrode G1a of a first transistor T1a. A portion of the active pattern 121a overlapping the gate electrode G1a may be a channel portion of the first transistor T1a. Accordingly, the active pattern 121a and the gate electrode G1a may form (or collectively define) the first transistor T1a.

The first transistor T1a disposed in the first sub-pixel circuit area SPCAa may be referred to as a first driving transistor. The first transistor T1b disposed in the second sub-pixel circuit area SPCAb may be referred to as a second driving transistor. The first transistor T1c disposed in the third sub-pixel circuit area SPCAc may be referred to as a third driving transistor.

The data write gate line 132 may extend in the first direction D1. The data write gate line 132 may be spaced apart from the first conductive pattern 131a in a fourth direction D4 opposite to the second direction D2. The data write gate signal GW may be applied to the data write gate line 132.

A portion of the data write gate line 132 overlapping the active pattern 121a may be a gate electrode G2a of a second transistor T2a, and another portion of the data write gate line 132 overlapping the active pattern 121a may be a gate electrode G3a of a third transistor T3a. A portion of the active pattern 121a overlapping the gate electrode G2a may be a channel portion of the second transistor T2a, and another portion of the active pattern 121a overlapping the gate electrode G3a may be a channel portion of the third transistor T3a. Accordingly, the active pattern 121a and the gate electrode G2a may form (or collectively define) the second transistor T2a, and the active pattern 121a and the gate electrode G3a may form the third transistor T3a.

The data initialization gate line 133 may extend in the first direction D1. The data initialization gate line 133 may be spaced apart from the data write gate line 132 in the fourth direction D4. The data initialization gate signal GI may be applied to the data initialization gate line 133.

A portion of the data initialization gate line 133 overlapping the active pattern 121a may be a gate electrode G4a of a fourth transistor T4a. A portion of the active pattern 121a overlapping the gate electrode G4a may be a channel portion of the fourth transistor T4a. Accordingly, the active pattern 121a and the gate electrode G4a may form (or collectively define) the fourth transistor T4a.

The emission control line 134 may extend in the first direction D1. The emission control line 134 may be spaced apart from the first conductive pattern 131a in the second direction D2. The emission control signal EM may be applied to the emission control line 134.

A portion of the emission control line 134 overlapping the active pattern 121a may be a gate electrode G5a of a fifth transistor T5a, and another portion of the emission control line 134 overlapping the active pattern 121a may be a gate electrode G6a of the sixth transistor T6a. A portion of the active pattern 121a overlapping the gate electrode G5a may be a channel portion of the fifth transistor T5a, and another portion of the active pattern 121a overlapping the gate electrode G6a may be a channel portion of the sixth transistor T6a. Accordingly, the active pattern 121a and the gate electrode G5a may form the fifth transistor T5a, and the active pattern 121a and the gate electrode G6a may form the sixth transistor T6a.

Similarly, the active pattern 121b and a gate electrode G6b may form a sixth transistor T6b, and the active pattern 121c and the gate electrode G6c may form a sixth transistor T6c. The sixth transistor T6a disposed in the first sub-pixel circuit area SPCAa may be referred to as a first emission control transistor. The sixth transistor T6b disposed in the second sub-pixel circuit area SPCAb may be referred to as a second emission control transistor. The sixth transistor T6c disposed in the third sub-pixel circuit area SPCAc may be referred to as a third emission control transistor.

The light emitting element initialization gate line 135 may extend in the first direction D1. The light emitting element initialization gate line 135 may be spaced apart from the emission control line 134 in the second direction D2. The light emitting element initialization gate signal GB may be applied to the light emitting element initialization gate line 135.

A portion of the light emitting element initialization gate line 135 overlapping the active pattern 121a may be a gate electrode G7a of a seventh transistor T7a. A portion of the active pattern 121a overlapping the gate electrode G7a may be a channel portion of the seventh transistor T7a. Accordingly, the active pattern 121a and the gate electrode G7a may form the seventh transistor T7a.

The second conductive layer 140 may be disposed on the first conductive layer 130. The second conductive layer 140 may include a conductive material.

A second insulating layer IL2 may be disposed between the first conductive layer 130 and the second conductive layer 140. The second insulating layer IL2 may include an inorganic insulating material.

The second conductive layer 140 may include second conductive patterns 141a, 141b, and 141c, a first initialization voltage line 142, and a second initialization voltage line 143.

The second conductive pattern 141a may overlap the first conductive pattern 131a. The first conductive pattern 131a and the second conductive pattern 141a may form a storage capacitor CSTa.

The first initialization voltage line 142 may extend in the first direction D1. The first initialization voltage line 142 may be spaced apart from the second conductive pattern 141a in the fourth direction D4. The first initialization voltage VINT may be applied to the first initialization voltage line 142.

The second initialization voltage line 143 may extend in the first direction D1. The second initialization voltage line 143 may be spaced apart from the second conductive pattern 141a in the second direction D2. The second initialization voltage VAINT may be applied to the second initialization voltage line 143.

Figure 7:
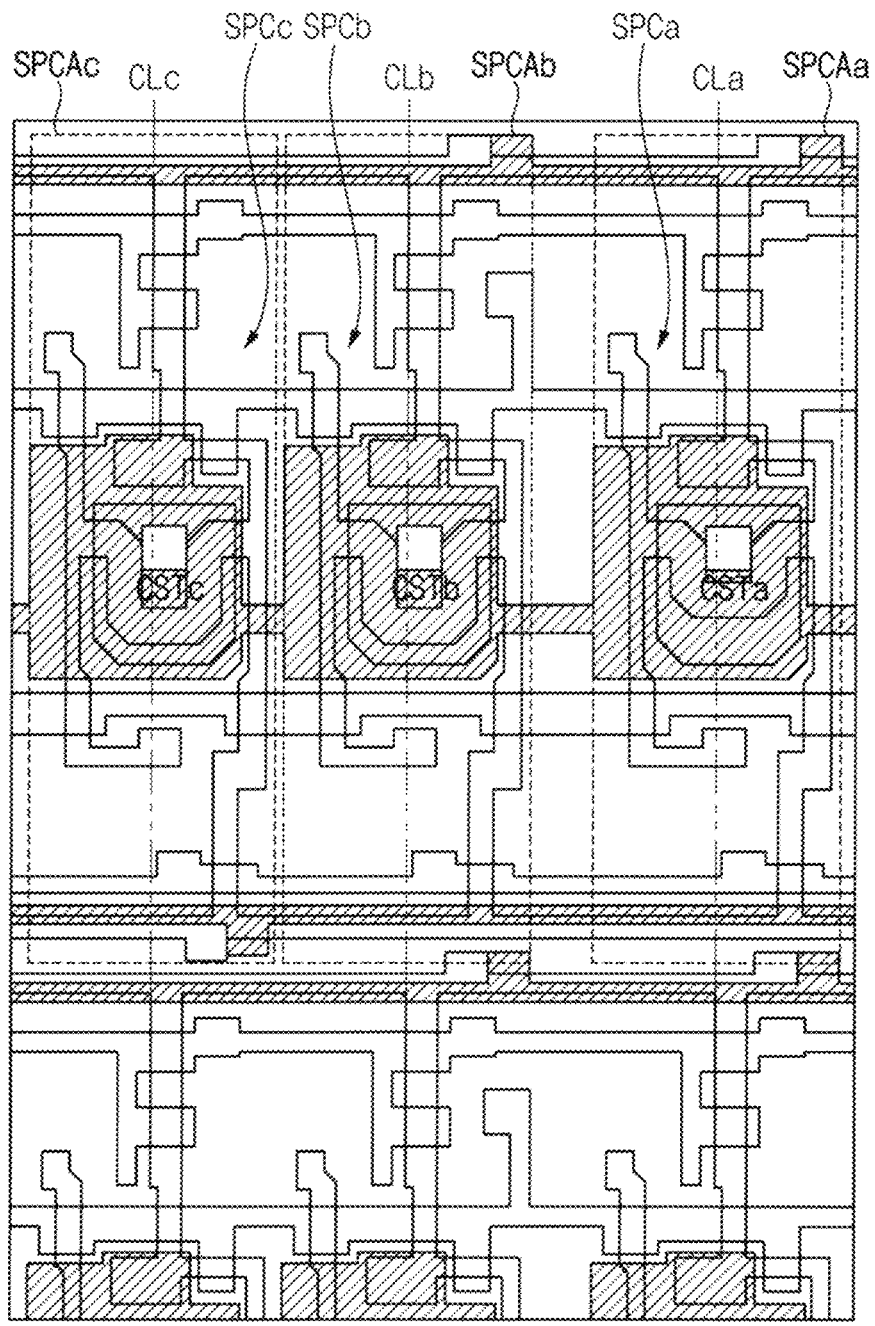
Figure 7:
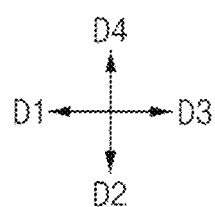
Figure 8:
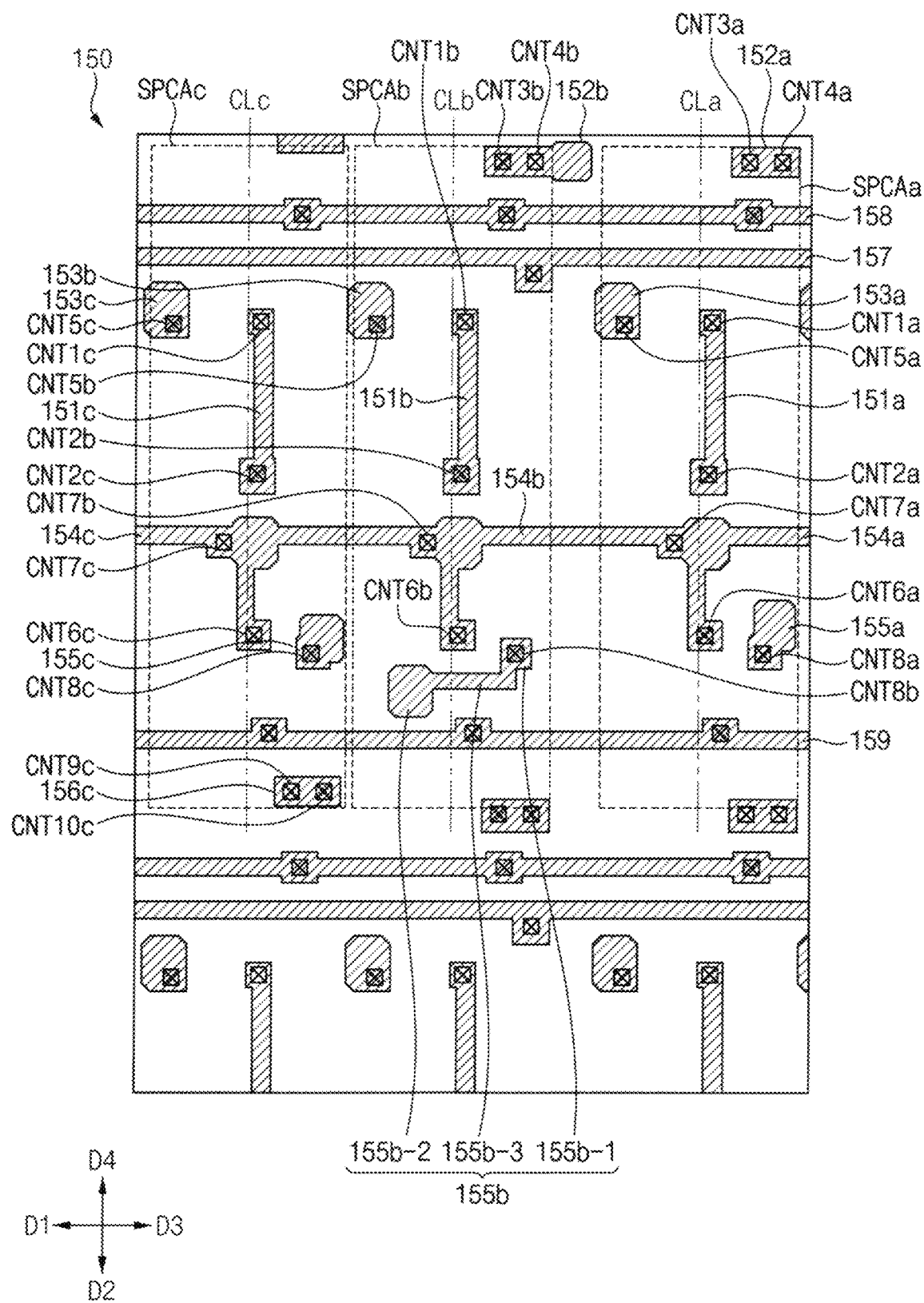
Figure 9:
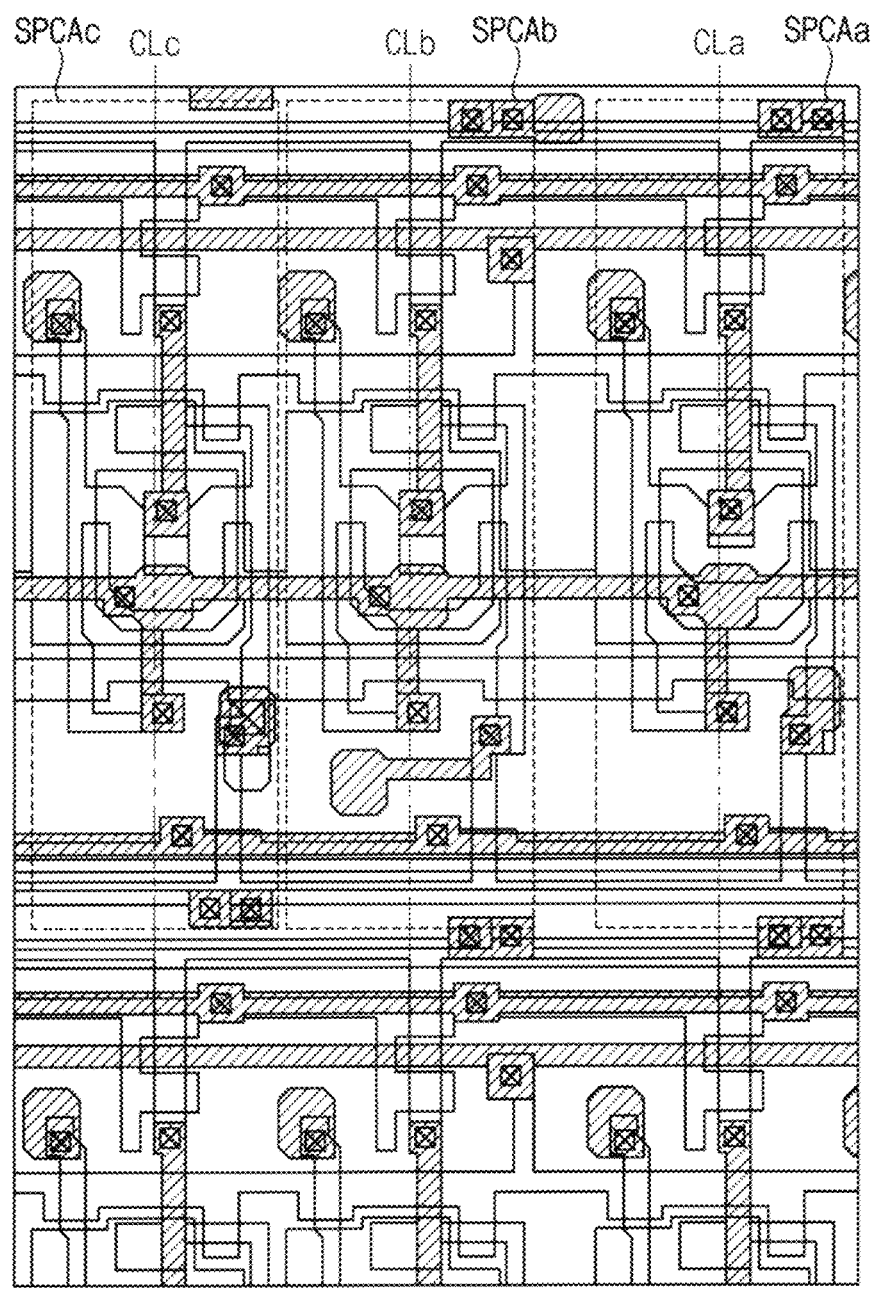
Figure 9:
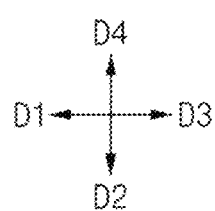
Figure 10:
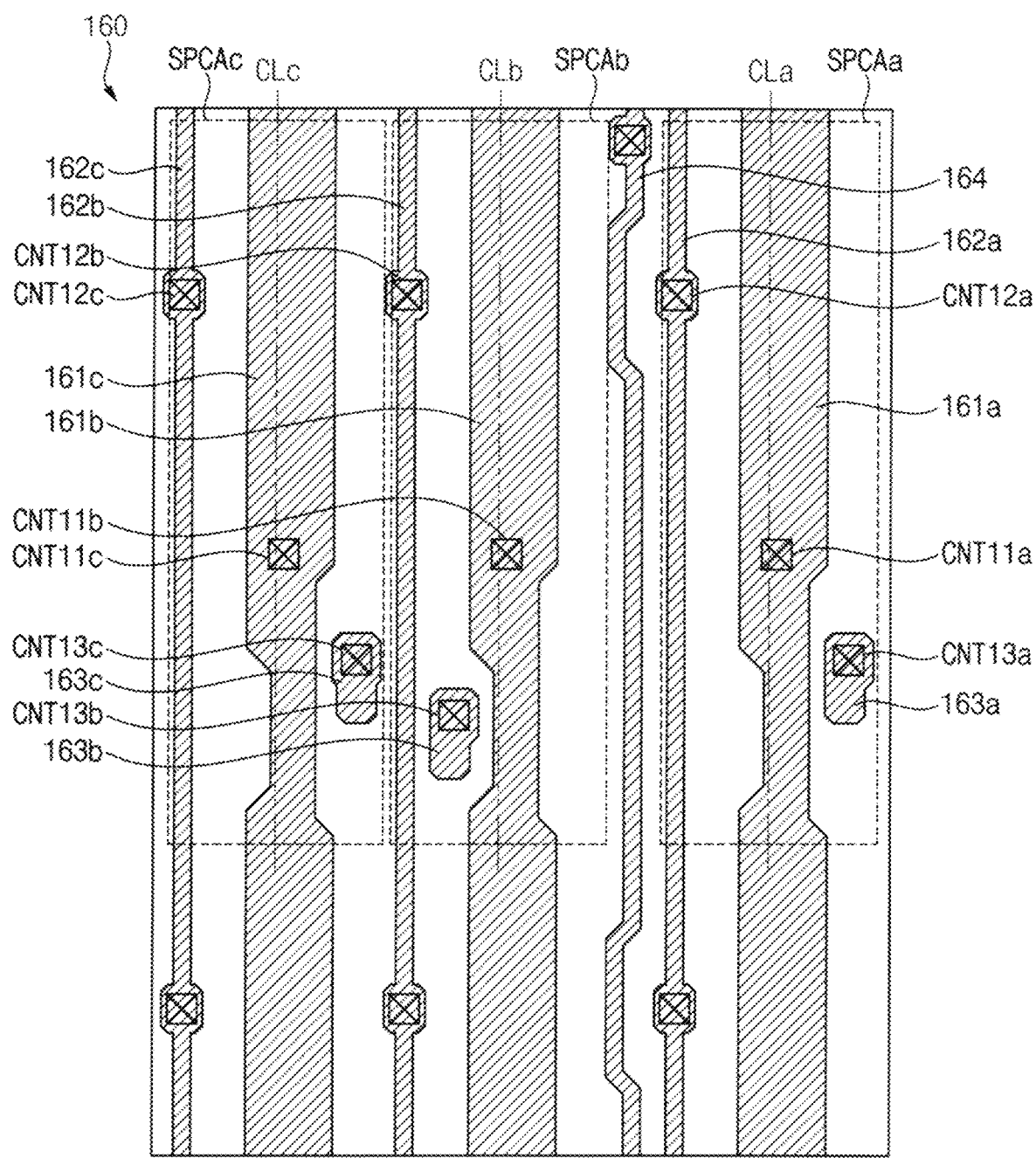
Figure 11:
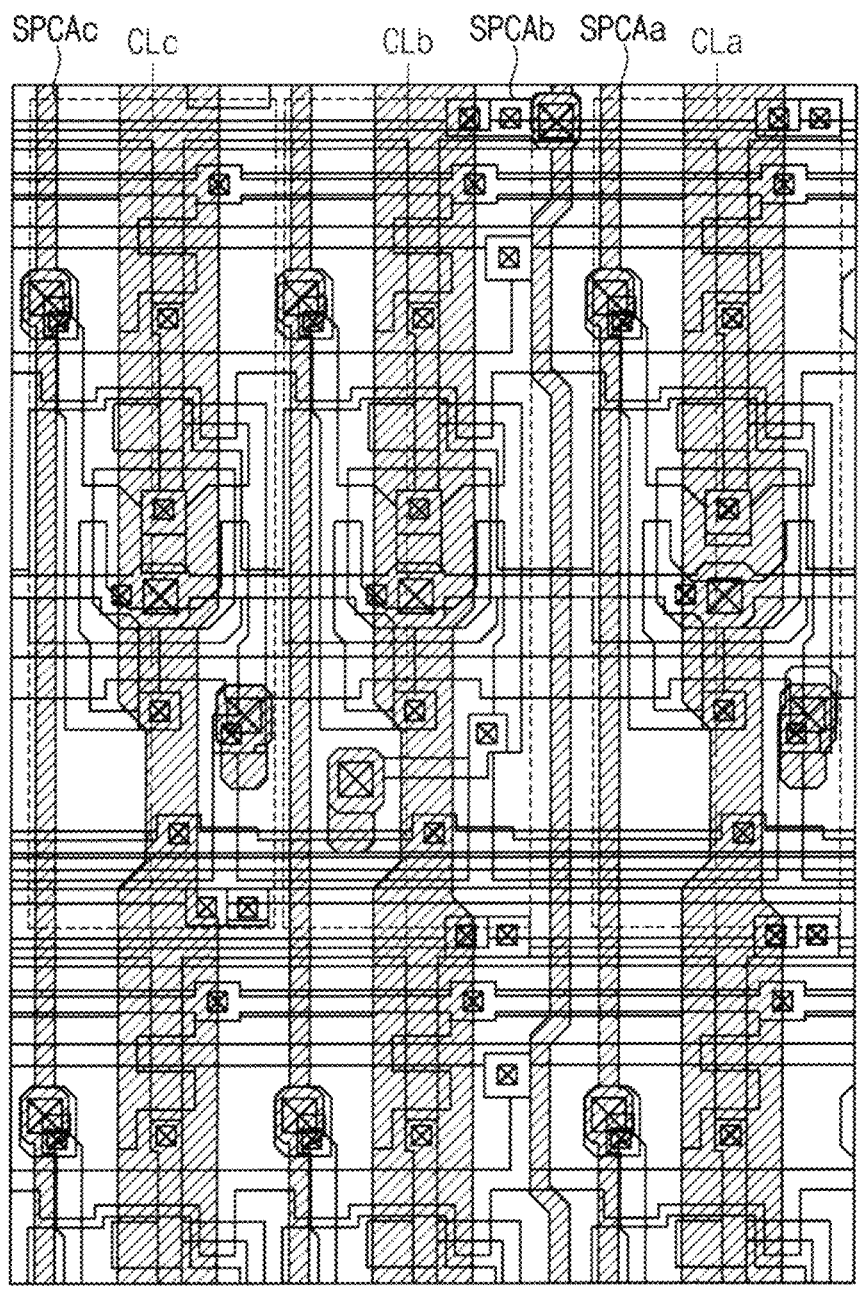
Figure 11:
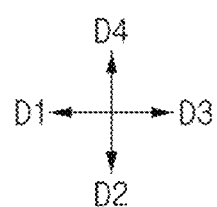
Figure 12:
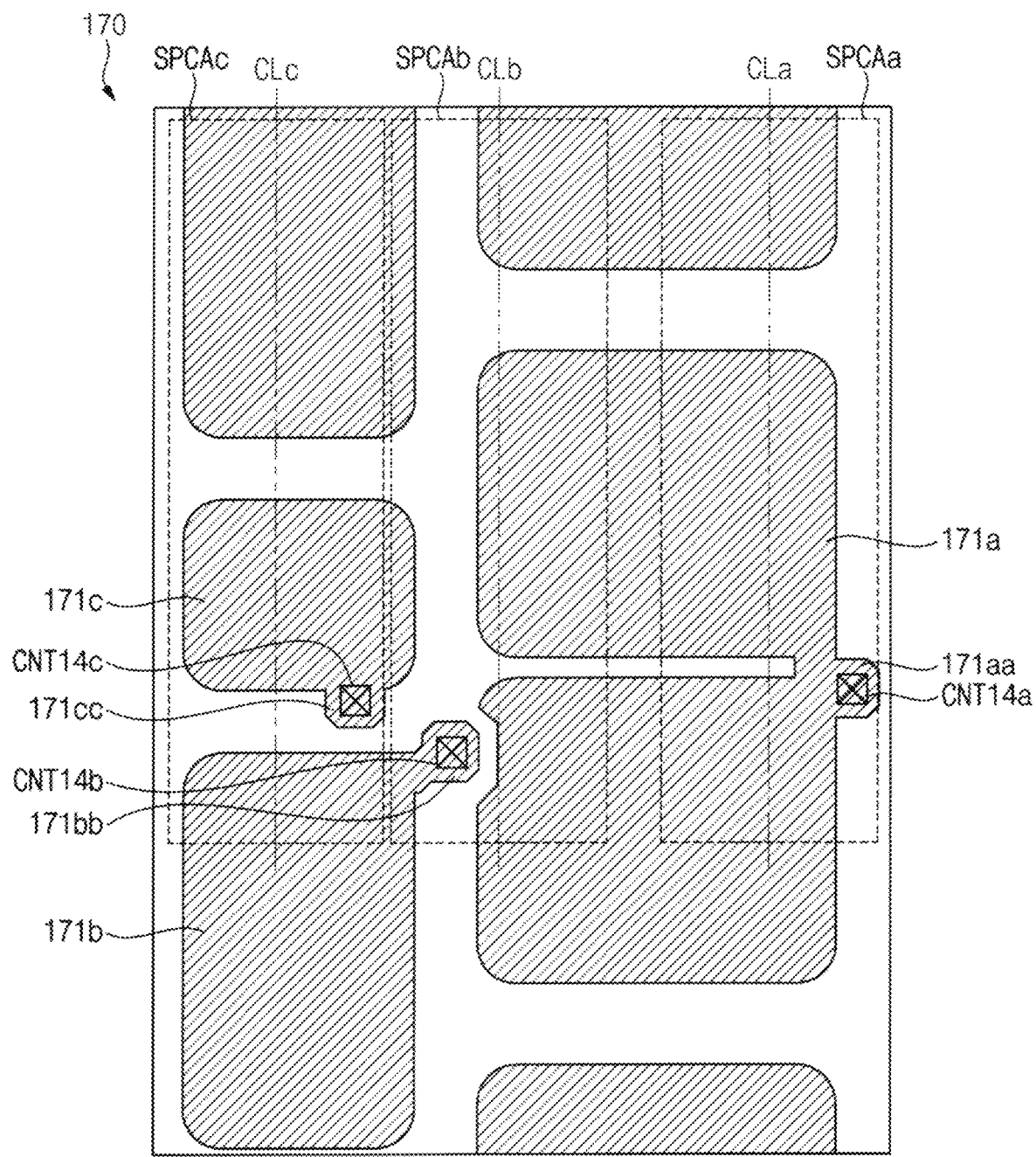
Figure 13:
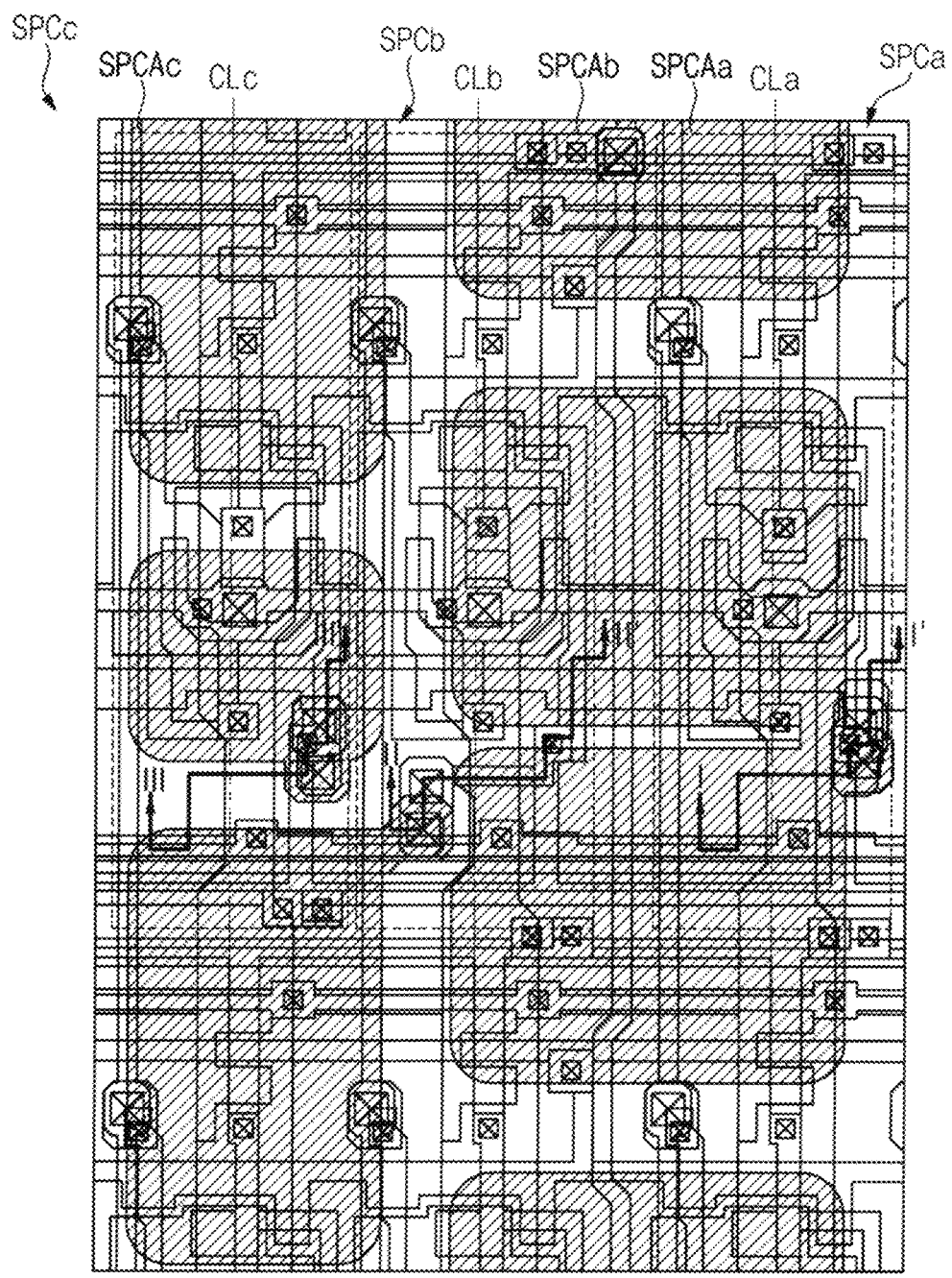
Figure 13:
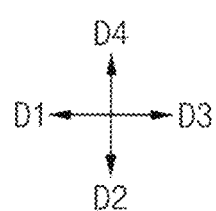

As illustrated in FIG. 7, the first sub-pixel circuit SPCa electrically connected to the first light emitting element LEDa may be disposed or formed in the first sub-pixel circuit area SPCAa. The second sub-pixel circuit SPCb electrically connected to the second light emitting element LEDb may be disposed or formed in the second sub-pixel circuit area SPCAb. The third sub-pixel circuit SPCc electrically connected to the third light emitting element LEDc may be disposed or formed in the third sub-pixel circuit area SPCAc.

The third conductive layer 150 may be disposed on the second conductive layer 140. The third conductive layer 150 may include a conductive material.

A third insulating layer IL3 may be disposed between the second conductive layer 140 and the third conductive layer 150. The third insulating layer IL3 may include an inorganic insulating material.

The third conductive layer 150 may include first connection patterns 151a, 151b, and 151c, second connection patterns 152a and 152b, first contact patterns 153a, 153b, and 153c, second contact patterns 154a, 154b, and 154c, third contact patterns 155a, 155b, and 155c, and a third connection pattern 156c. The third contact patterns 155a, 155b, and 155c may be referred to as lower contact patterns.

The first connection pattern 151a may be connected to the active pattern 121a through a first contact hole CNT1a and may be connected to the first conductive pattern 131a through a second contact hole CNT2a. Accordingly, the first connection pattern 151a may connect the active pattern 121a and the first conductive pattern 131a. The storage capacitor CSTa may be electrically connected to the fourth transistor T4a by the first connection pattern 151a. The first connection patterns 151b and 151c may be substantially the same as or similar to the first connection pattern 151a. The first connection pattern 151b may be connected to the active pattern 121b through a first contact hole CNT1b and may be connected to the first conductive pattern 131b through a second contact hole CNT2b, and the first connection pattern 151c may be connected to the active pattern 121c through a first contact hole CNT1c and may be connected to the first conductive pattern 131c through a second contact hole CNT2c.

The second connection patterns 152a and 152b may be connected to the active layer 120 through third contact holes CNT3a and CNT3b, respectively, and may be connected to the first initialization voltage line 142 through fourth contact holes CNT4a and CNT4b, respectively. Accordingly, the second connection patterns 152a and 152b may connect the active layer 120 and the first initialization voltage line 142. The first initialization voltage line 142 may be electrically connected to the fourth transistors T4a, T4b, and T4c by the second connection patterns 152a and 152b.

The first contact pattern 153a may be connected to the active pattern 121a through a fifth contact hole CNT5a. Accordingly, the first contact pattern 153a may be electrically connected to the second transistor T2a. The first contact patterns 153b and 153c may be substantially the same as or similar to the first contact pattern 153a. The first contact pattern 153b may be connected to the active pattern 121b through a fifth contact hole CNT5b, and the first contact pattern 153c may be connected to the active pattern 121c through a fifth contact hole CNT5c.

The second contact pattern 154a may be connected to the active pattern 121a through a sixth contact hole CNT6a and may be connected to the second conductive pattern 141a through a seventh contact hole CNT7a. Accordingly, the second contact pattern 154a may be electrically connected to the fifth transistor T5a and the storage capacitor CSTa. The second contact patterns 154b and 154c may be substantially the same as or similar to the second contact pattern 154a. The second contact pattern 154b may be connected to the active pattern 121b through a sixth contact hole CNT6b and may be connected to the second conductive pattern 141b through a seventh contact hole CNT7b, and the second contact pattern 154c may be connected to the active pattern 121c through a sixth contact hole CNT6c and may be connected to the second conductive pattern 141c through a seventh contact hole CNT7c.

In an embodiment, the third contact pattern 155a disposed in the first sub-pixel circuit area SPCAa may be disposed in the first side portion (e.g., the right portion) of the first sub-pixel circuit area SPCAa. In such an embodiment, the third contact pattern 155a may be positioned in the third direction D3 from the first central line CLa. The third contact pattern 155a may be connected to the portion 122a of the active pattern 121a through an eighth contact hole CNT8a. Accordingly, the third contact pattern 155a may be electrically connected to the sixth transistor T6a. The third contact pattern 155a disposed in the first sub-pixel circuit area SPCAa may be referred to as a first lower contact pattern.

The third contact pattern 155b disposed in the second sub-pixel circuit area SPCAb may include a first end portion 155b-1, a second end portion 155b-2, and a connection portion 155b-3 connecting the first end portion 155b-1 and the second end portion 155b-2.

In an embodiment, the first end portion 155b-1 may be disposed in a first side portion of the second sub-pixel circuit area SPCAb, and the second end portion 155b-2 may be disposed in a second side portion opposite to the first side portion of the second sub-pixel circuit area SPCAb. The first side portion may be a side portion (e.g., a right portion) in the third direction D3 from a second central line CLb. The second central line CLb may be defined as an imaginary line extending in the second direction D2 through a center of the second sub-pixel circuit area SPCAb. The second side portion may be a side portion (e.g., a left portion) in the first direction D1 from the second central line CLb. In such an embodiment, the first end portion 155b-1 may be positioned in the third direction D3 from the second central line CLb, and the second end portion 155b-2 may be positioned in the first direction D1 from the second central line CLb. The connection portion 155b-3 may extend in the first direction D1 and may overlap the second central line CLb.

The first end portion 155b-1 of the third contact pattern 155b may overlap a portion 122b of the active pattern 121b. The first end portion 155b-1 of the third contact pattern 155b may be connected to the portion 122b of the active pattern 121b through an eighth contact hole CNT8b. Accordingly, the third contact pattern 155b may be electrically connected to the sixth transistor T6b. The third contact pattern 155b disposed in the second sub-pixel circuit area SPCAb may be referred to as a second lower contact pattern.

In an embodiment, the third contact pattern 155c disposed in the third sub-pixel circuit area SPCAc may be disposed in a first side portion of the third sub-pixel circuit area SPCAc. The first side portion may be a side portion (e.g., a right portion) in the third direction D3 from a third central line CLc. The third central line CLc may be defined as an imaginary line extending in the second direction D2 through a center of the third sub-pixel circuit area SPCAc. The third contact pattern 155c may be connected to a portion 122c of the active pattern 121c through an eighth contact hole CNT8c. Accordingly, the third contact pattern 155c may be electrically connected to the sixth transistor T6c. The third contact pattern 155c disposed in the third sub-pixel circuit area SPCAc may be referred to as a third lower contact pattern.

The second end portion 155b-2 of the third contact pattern 155b disposed in the second sub-pixel circuit area SPCAb may be disposed between the first end portion 155b-1 and the third contact pattern 155c disposed in the third sub-pixel circuit area SPCAc.

The third connection pattern 156c may be connected to the active layer 120 through a ninth contact hole CNT9c and may be connected to the second initialization voltage line 143 through a tenth contact hole CNT10c. Accordingly, the third connection pattern 156c may connect the active layer 120 and the second initialization voltage line 143. The second initialization voltage line 143 may be electrically connected to the seventh transistors T7a, T7b, and T7c by the third connection pattern 156c.

In an embodiment, the third conductive layer 150 may further include gate transmission lines 157, 158, and 159. Each of the gate transmission lines 157, 158, and 159 may extend in the first direction D1. The gate transfer lines 157, 158, and 159 may be connected to the data write gate line 132, the data initialization gate line 133, and the light emitting element initialization gate line 135 through contact holes, respectively.

The fourth conductive layer 160 may be disposed on the third conductive layer 150. The fourth conductive layer 160 may include a conductive material.

A fourth insulating layer IL4 may be disposed between the third conductive layer 150 and the fourth conductive layer 160. The fourth insulating layer IL4 may include an inorganic insulating material.

The fourth conductive layer 160 may include driving voltage lines 161a, 161b, and 161c, data lines 162a, 162b, and 162c, and fourth contact patterns 163a, 163b, and 163c. The fourth contact patterns 163a, 163b, and 163c may be referred to as upper contact patterns.

The driving voltage line 161a disposed in the first sub-pixel circuit area SPCAa may extend in the second direction D2. The first power voltage ELVDD may be applied to the driving voltage line 161a. The driving voltage line 161a may transfer the first power voltage ELVDD to the first sub-pixel circuit SPCa. The driving voltage line 161a may be connected to the second contact pattern 154a through an eleventh contact hole CNT11a. Accordingly, the driving voltage line 161a may be electrically connected to the fifth transistor T5a and the storage capacitor CSTa by the second contact pattern 154a.

In an embodiment, the driving voltage line 161a may overlap the first central line CLa. The third contact pattern 155a may be positioned in the third direction D3 from the driving voltage line 161a.

The driving voltage line 161b disposed in the second sub-pixel circuit area SPCAb may extend in the second direction D2. The first power voltage ELVDD may be applied to the driving voltage line 161b. The driving voltage line 161b may transfer the first power voltage ELVDD to the second sub-pixel circuit SPCb. The driving voltage line 161b may be connected to the second contact pattern 154b through an eleventh contact hole CNT11b. Accordingly, the driving voltage line 161b may be electrically connected to a fifth transistor T5b and a storage capacitor CSTb by the second contact pattern 154b.

In an embodiment, the driving voltage line 161a may overlap the second central line CLb. The driving voltage line 161b may overlap the connection portion 155b-3 of the third contact pattern 155b. In such an embodiment, the first end portion 155b-1 and the second end portion 155b-2 of the third contact pattern 155b may be spaced apart from each other with the driving voltage line 161b interposed therebetween in a plan view.

The driving voltage line 161c disposed in the third sub-pixel circuit area SPCAc may extend in the second direction D2. The first power voltage ELVDD may be applied to the driving voltage line 161c. The driving voltage line 161c may transfer the first power voltage ELVDD to the third sub-pixel circuit SPCc. The driving voltage line 161c may be connected to the second contact pattern 154c through an eleventh contact hole CNT11c. Accordingly, the driving voltage line 161c may be electrically connected to a fifth transistor T5c and a storage capacitor CSTc by the second contact pattern 154c.

In an embodiment, the driving voltage line 161c may overlap the third central line CLc. The third contact pattern 155c may be positioned in the third direction D3 from the driving voltage line 161c.

The driving voltage line 161a disposed in the first sub-pixel circuit area SPCAa may be referred to as a first driving voltage line. The driving voltage line 161b disposed in the second sub-pixel circuit area SPCAb may be referred to as a second driving voltage line. The driving voltage line 161c disposed in the third sub-pixel circuit area SPCAc may be referred to as a third driving voltage line.

The data line 162a disposed in the first sub-pixel circuit area SPCAa may extend in the second direction D2. The data line 162a may be spaced apart from the driving voltage line 161a in the first direction D1. The data voltage VDATA may be applied to the data line 162a. The data line 162a may be connected to the first contact pattern 153a through a twelfth contact hole CNT12a. Accordingly, the data line 162a may be electrically connected to the second transistor T2a by the first contact pattern 153a. The data lines 162b and 162c may be substantially the same as or similar to the data line 162a. The data line 162b may be connected to the first contact pattern 153b through a twelfth contact hole CNT12b, and the data line 162c may be connected to the first contact pattern 153c through a twelfth contact hole CNT12c.

In an embodiment, the fourth contact pattern 163a disposed in the first sub-pixel circuit area SPCAa may be spaced apart from the driving voltage line 161a in the third direction D3. In such an embodiment, the fourth contact pattern 163a may be disposed in the first side portion (e.g., the right portion) of the first sub-pixel circuit area SPCAa. The fourth contact pattern 163a may be positioned in the third direction D3 from the first central line CLa. The fourth contact pattern 163a may be connected to the third contact pattern 155a through a thirteenth contact hole CNT13a. Accordingly, the fourth contact pattern 163a may be electrically connected to the sixth transistor T6a. The fourth contact pattern 163a disposed in the first sub-pixel circuit area SPCAa may be referred to as a first upper contact pattern.

In an embodiment, the fourth contact pattern 163b disposed in the second sub-pixel circuit area SPCAb may be spaced apart from the driving voltage line 161b in the first direction D1. That is, the fourth contact pattern 163b may be disposed in the second side portion (e.g., the left portion) of the second sub-pixel circuit area SPCAb. The fourth contact pattern 163b may be positioned in the first direction D1 from the second central line CLb.

The fourth contact pattern 163b may be connected to the third contact pattern 155b through a thirteenth contact hole CNT13b. In one embodiment, for example, the fourth contact pattern 163b may be connected to the second end portion 155b-2 of the third contact pattern 155b through the thirteenth contact hole CNT13b. Accordingly, the fourth contact pattern 163b may be electrically connected to the sixth transistor T6b. The fourth contact pattern 163b may overlap the second end portion 155b-2 of the third contact pattern 155b and may not overlap the first end portion 155b-1 of the third contact pattern 155b. The fourth contact pattern 163b disposed in the second sub-pixel circuit area SPCAb may be referred to as a second upper contact pattern.

In an embodiment, the fourth contact pattern 163c disposed in the third sub-pixel circuit area SPCAc may be spaced apart from the driving voltage line 161c in the third direction D3. In such an embodiment, the fourth contact pattern 163c may be disposed in the first side portion (e.g., the right portion) of the third sub-pixel circuit area SPCAc. The fourth contact pattern 163c may be positioned in the third direction D3 from the third central line CLc. The fourth contact pattern 163c may be connected to the third contact pattern 155c through a thirteenth contact hole CNT13c. Accordingly, the fourth contact pattern 163c may be electrically connected to the sixth transistor T6c. The fourth contact pattern 163c disposed in the third sub-pixel circuit area SPCAc may be referred to as a third upper contact pattern.

The fourth contact pattern 163b may be disposed to be adjacent to the fourth contact pattern 163c rather than the fourth contact pattern 163a. A distance between the fourth contact patterns 163a and 163b in the first direction D1 may be greater than a distance between the fourth contact patterns 163b and 163c in the first direction D1.

In an embodiment, the fourth conductive layer 160 may further include an initialization voltage transmission line 164. The initialization voltage transmission line 164 may extend in the second direction D2. The initialization voltage transmission line 164 may be connected to the second connection pattern 152b through a contact hole. Accordingly, the initialization voltage transmission line 164 may be electrically connected to the first initialization voltage line 142 and the fourth transistors T4a, T4b, and T4c by the second connection pattern 152b.

The fifth conductive layer 170 may be disposed on the fourth conductive layer 160. The fifth conductive layer 170 may include a conductive material.

A fifth insulating layer IL5 may be disposed between the fourth conductive layer 160 and the fifth conductive layer 170. The fifth insulating layer IL5 may include an inorganic insulating material and/or an organic insulating material. The organic insulating material may include a photoresist, a polyacryl-based resin, a polyimide-based resin, a polyamide-based resin, a siloxane-based resin, an acryl-based resin, an epoxy-based resin, or the like. These can be used alone or in a combination thereof.

The fifth conductive layer 170 may include first electrodes 171a, 171b, and 171c that are spaced apart from each other. The first electrode 171a may be an anode electrode of the first light emitting element LEDa electrically connected to the first sub-pixel circuit SPCa. The first electrode 171a may be referred to as a first anode electrode. The first electrode 171b may be an anode electrode of the second light emitting element LEDb electrically connected to the second sub-pixel circuit SPCb. The first electrode 171b may be referred to as a second anode electrode. The first electrode 171c may be an anode electrode of the third light emitting element LEDc electrically connected to the third sub-pixel circuit SPCc. The first electrode 171c may be referred to as a third anode electrode.

In an embodiment, the first electrodes 171a, 171b, and 171c may have different areas (i.e., different sizes). In one embodiment, for example, an area of the first electrode 171a may be greater than each of an area of the first electrode 171b and an area of the first electrode 171c. The area of the first electrode 171b may be greater than the area of the first electrode 171c.

In one embodiment, for example, the first electrode 171a electrically connected to the first sub-pixel circuit SPCa may be disposed to overlap a portion of the first sub-pixel circuit area SPCAa, a portion of the second sub-pixel circuit area SPCAb, a portion of a first sub-pixel circuit area of an adjacent pixel in the second direction D2, and a portion of a second sub-pixel circuit area of the adjacent pixel, but embodiments are not limited thereto.

In an embodiment, the first electrode 171a may include a contact portion 171aa overlapping the fourth contact pattern 163a. In such an embodiment, the contact portion 171aa may be positioned in the third direction D3 from the first central line CLa. The contact portion 171aa may be connected to the fourth contact pattern 163a through a fourteenth contact hole CNT14a. Accordingly, the first electrode 171a may be electrically connected to the sixth transistor T6a by the third contact pattern 155a and the fourth contact pattern 163a. The contact portion 171aa of the first electrode 171a may be referred to as a first contact portion.

In an embodiment, the first electrode 171b electrically connected to the second sub-pixel circuit SPCb may be spaced apart from the first electrode 171a in the first direction D1. In one embodiment, for example, the first electrode 171b may be disposed to overlap a portion of the second sub-pixel circuit area SPCAb, a portion of the third sub-pixel circuit area SPCAc, and a portion of a third sub-pixel circuit area of the adjacent pixel, but embodiments are not limited thereto.

In an embodiment, the first electrode 171b may include a contact portion 171bb overlapping the fourth contact pattern 163b. In such an embodiment, the contact portion 171bb may be positioned in the first direction D1 from the second central line CLb. The first electrode 171b may be connected to the fourth contact pattern 163b through a fourteenth contact hole CNT14b. Accordingly, the first electrode 171b may be electrically connected to the sixth transistor T6b by the third contact pattern 155b and the fourth contact pattern 163b. The contact portion 171bb of the first electrode 171b may be referred to as a second contact portion.

In an embodiment, the first electrode 171c electrically connected to the third sub-pixel circuit SPCc may be spaced apart from the first electrode 171a in the first direction D1 and may be spaced apart from the first electrode 171b in the fourth direction D4. In one embodiment, for example, the first electrode 171c may be disposed to overlap a portion of the second sub-pixel circuit area SPCAb and a portion of the third sub-pixel circuit area SPCAc, but embodiments are not limited thereto.

In an embodiment, the first electrode 171c may include a contact portion 171cc overlapping the fourth contact pattern 163c. In such an embodiment, the contact portion 171cc may be positioned in the third direction D3 from the third central line CLc. The first electrode 171c may be connected to the fourth contact pattern 163c through a fourteenth contact hole CNT14c. Accordingly, the first electrode 171c may be electrically connected to the sixth transistor T6c by the third contact pattern 155c and the fourth contact pattern 163c. The contact portion 171cc of the first electrode 171c may be referred to as a third contact portion.

The contact portion 171aa of the first electrode 171a and the contact portion 171bb of the first electrode 171b may be spaced apart from each other by a relatively great distance. In one embodiment, for example, a distance between the contact portions 171aa and 171bb in the first direction D1 may be greater than a distance between the first and second central lines CLa and CLb in the first direction D1 or a distance between the driving voltage lines 161a and 161b in the first direction D1.

The contact portion 171bb of the first electrode 171b may be disposed to be adjacent to the contact portion 171cc of the first electrode 171c rather than the contact portion 171aa of the first electrode 171a. A distance between the contact portions 171aa and 171bb in the first direction D1 may be greater than a distance between the contact portions 171bb and 171cc in the first direction D1.

A sixth insulating layer IL6 may be disposed on the fifth conductive layer 170. The sixth insulating layer IL6 may be disposed on the fifth insulating layer IL5 to cover the first electrodes 171a, 171b, and 171c. Pixel openings respectively exposing at least a portion of each of the first electrodes 171a, 171b, and 171c are defined in the sixth insulating layer IL6. In an embodiment, the pixel openings may respectively expose a central portion of each of the first electrodes 171a, 171b, and 171c, and the sixth insulating layer IL6 may cover peripheral portions of the first electrodes 171a, 171b, and 171c. The sixth insulating layer IL6 may include an organic insulating material.

The emission layers 180a, 180b, and 180c may be disposed on the fifth conductive layer 170. The emission layers 180a, 180b, and 180c may be disposed on the first electrodes 171a, 171b, and 171c exposed by the pixel openings, respectively. In one embodiment, for example, the emission layers 180a, 180b, and 180c may have a shape corresponding to the first electrodes 171a, 171b, and 171c, respectively. In an embodiment, each of the emission layers 180a, 180b, and 180c may include at least one selected from an organic light emitting material and quantum dot.

The sixth conductive layer may be disposed on the emission layers 180a, 180b, and 180c. The sixth conductive layer may include a conductive material. The sixth conductive layer may include second electrodes 190a, 190b, and 190c respectively disposed on the emission layers 180a, 180b, and 180c. In an embodiment, the second electrodes 190a, 190b, and 190c may be integrally formed with each other as a single unit. The second electrodes 190a, 190b, and 190c may also be disposed on the sixth insulating layer IL6. The first electrode 171a, the emission layer 180a, and the second electrode 190a may form (or collectively define) the first light emitting element LEDa. The first electrode 171b, the emission layer 180b, and the second electrode 190b may form the second light emitting element LEDb. The first electrode 171c, the emission layer 180c, and the second electrode 190c may form the third light emitting element LEDc.

In embodiments, as described above, the first electrodes 171a, 171b, and 171c may have different areas from each other. In such embodiments, due to a difference in lifetime of the first to third light emitting elements LEDa, LEDb, and LEDc that emit light of different colors, respectively, an area of the emission layer 180a of the first light emitting element LEDa that emit blue light may be greater than each of an area of the emission layer 180b of the second light emitting element LEDb that emit green light and an area of the emission layer 180c of the third light emitting element LEDc that emit red light. Accordingly, the area of the first electrode 171a may be greater than each of the area of the first electrode 171b and the area of the first electrode 171c. If the fourth contact pattern 163b of the second sub-pixel circuit SPCb is disposed in the first side portion (e.g., the right portion) of the second sub-pixel circuit area SPCAb, the contact portion 171bb of the first electrode 171b connected to the second sub-pixel circuit SPCb may also be disposed in the first side portion of the second sub-pixel circuit area SPCAb. In this case, in order to separate the first electrode 171b (i.e., the fourth contact pattern 163b) from the first electrode 171a having a relatively great area, the second and third sub-pixel circuits SPCb and SPCc may be farther away from the first sub-pixel circuit SPCa in the first direction D1 (e.g., to the left), or sizes of the second and third sub-pixel circuits SPCb and SPCc may be reduced. Accordingly, an image quality characteristic of each pixel may be reduced.

In embodiments of the invention, the second end portion 155b-2 of the third contact pattern 155b may be disposed in the second side portion (e.g., the left portion) of the second sub-pixel circuit area SPCAb. Accordingly, the fourth contact pattern 163b and the contact portion 171bb of the first electrode 171b may be disposed in the second side portion of the second sub-pixel circuit area SPCAb. Accordingly, even if the first electrode 171a has a relatively great area, the first to third sub-pixel circuits SPCa, SPCb, and SPCc may be relatively uniformly disposed while the first electrodes 171a, 171b, and 171c are spaced apart from each other. Accordingly, the image quality characteristic of each pixel may be improved, and a display quality of the display device may be improved.

In an embodiment, although not illustrated in the drawings, the contact portion 171cc of the first electrode 171c may be disposed in a second side portion opposite to the first side portion of the third sub-pixel circuit area SPCAc. The second side portion may be a side portion (e.g., a left portion) in the first direction D1 from the third central line CLc. In such an embodiment, the third contact pattern 155c disposed in the third sub-pixel circuit area SPCAc may have substantially a same shape as or a similar shape to the third contact pattern 155b disposed in the second sub-pixel circuit area SPCAb. In such an embodiment, the fourth contact pattern 163c and the contact portion 171cc of the first electrode 171c may be positioned in the first direction D1 from the third central line CLc.

Figure 24:
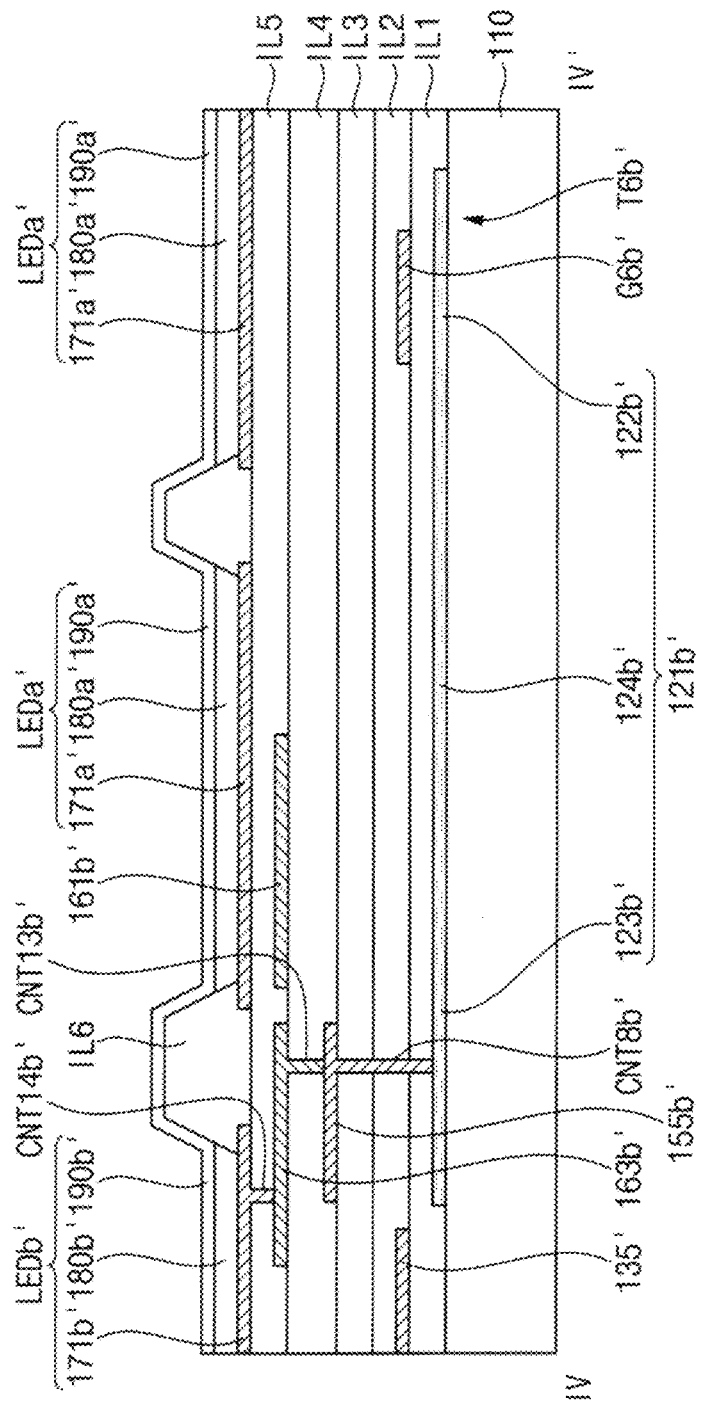
FIG. 24 is a cross-sectional view taken along line IV-IV' of FIG. 23.
Figure 25:
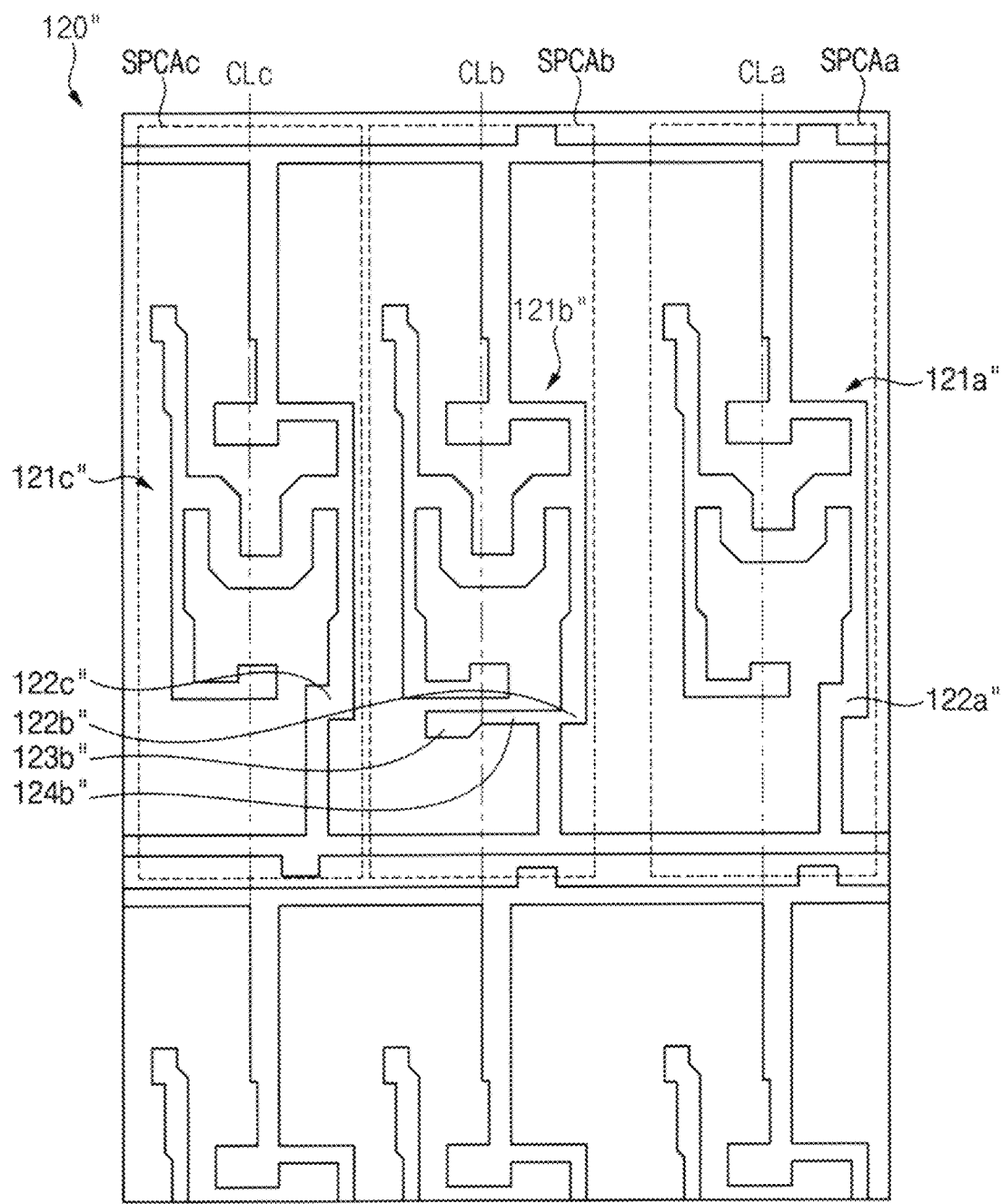
FIGS. 25 to 30 are plan views illustrating layers of a pixel included in a display device according to another alternative embodiment.
Figure 26:
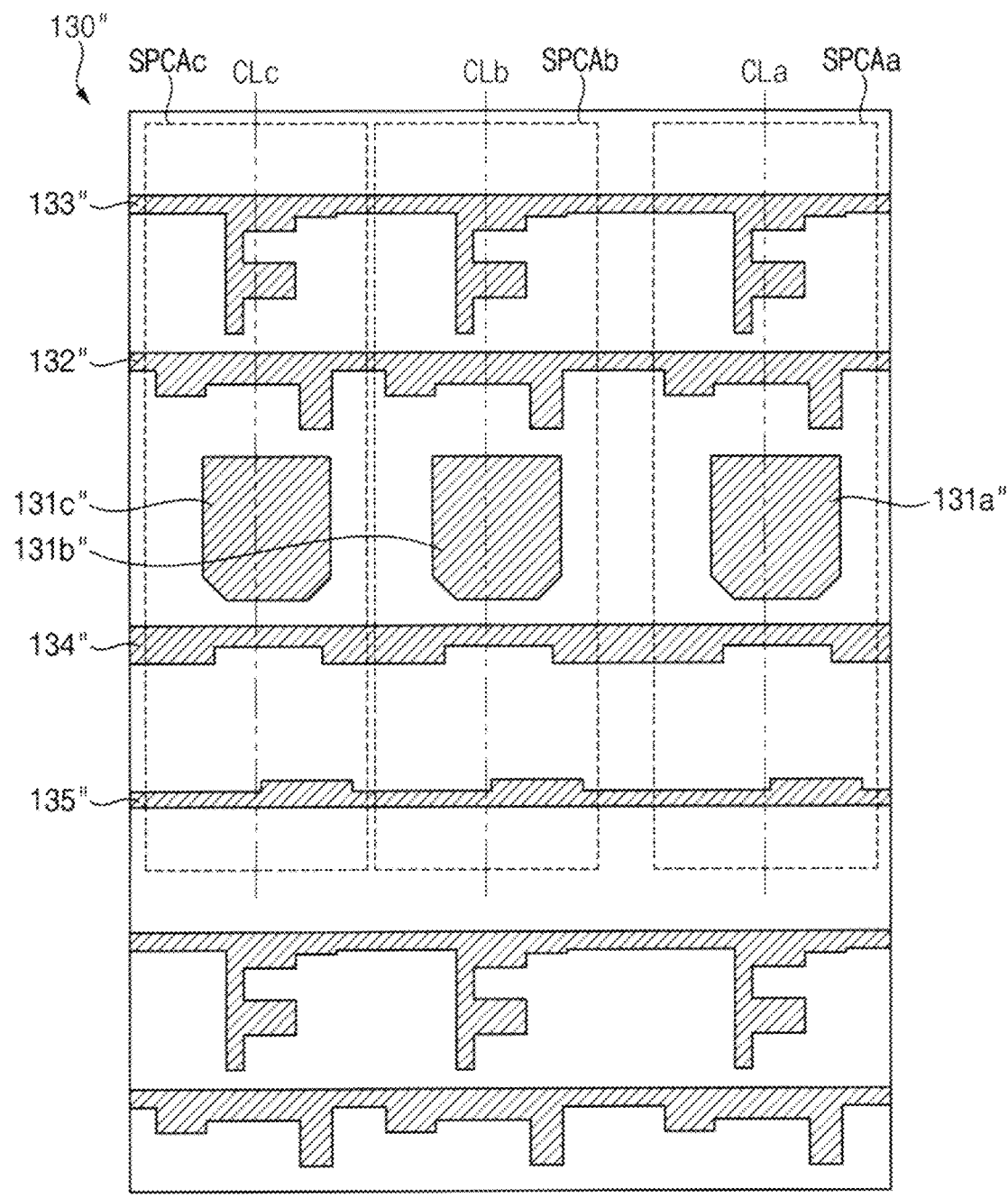
Figure 26:
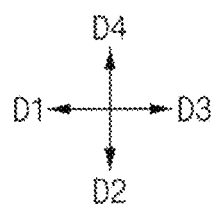
Figure 27:
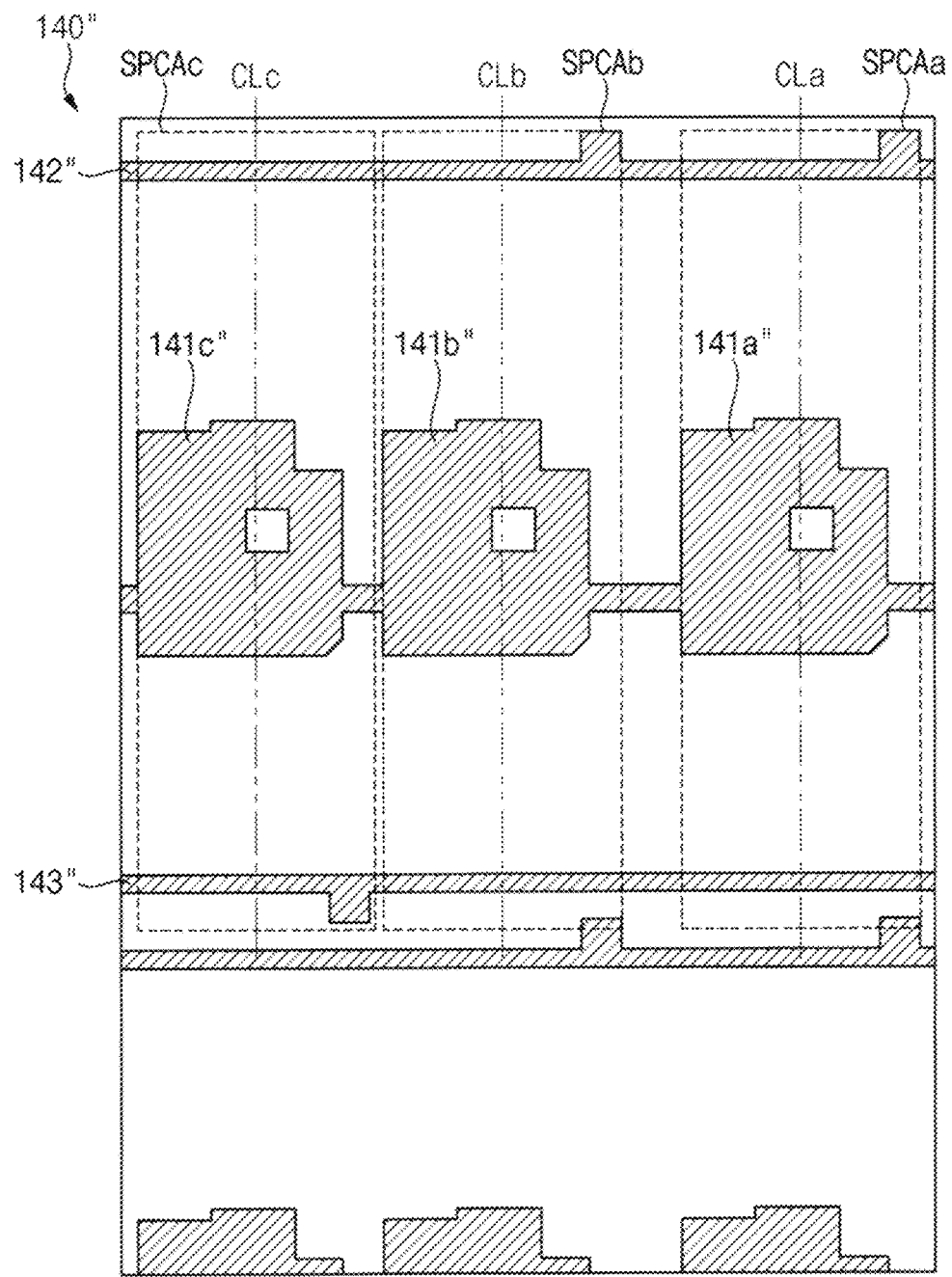
Figure 28:
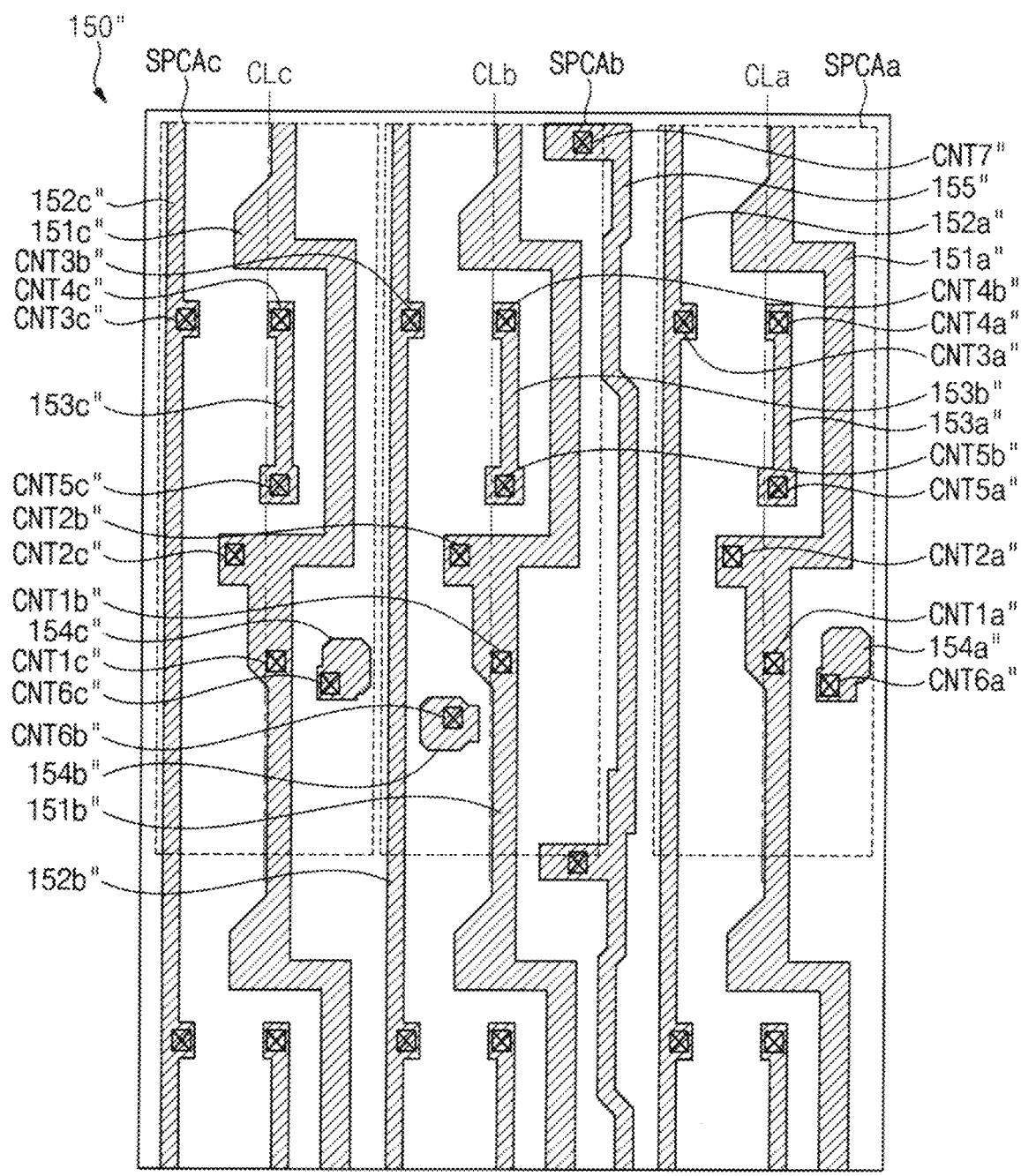
Figure 29:
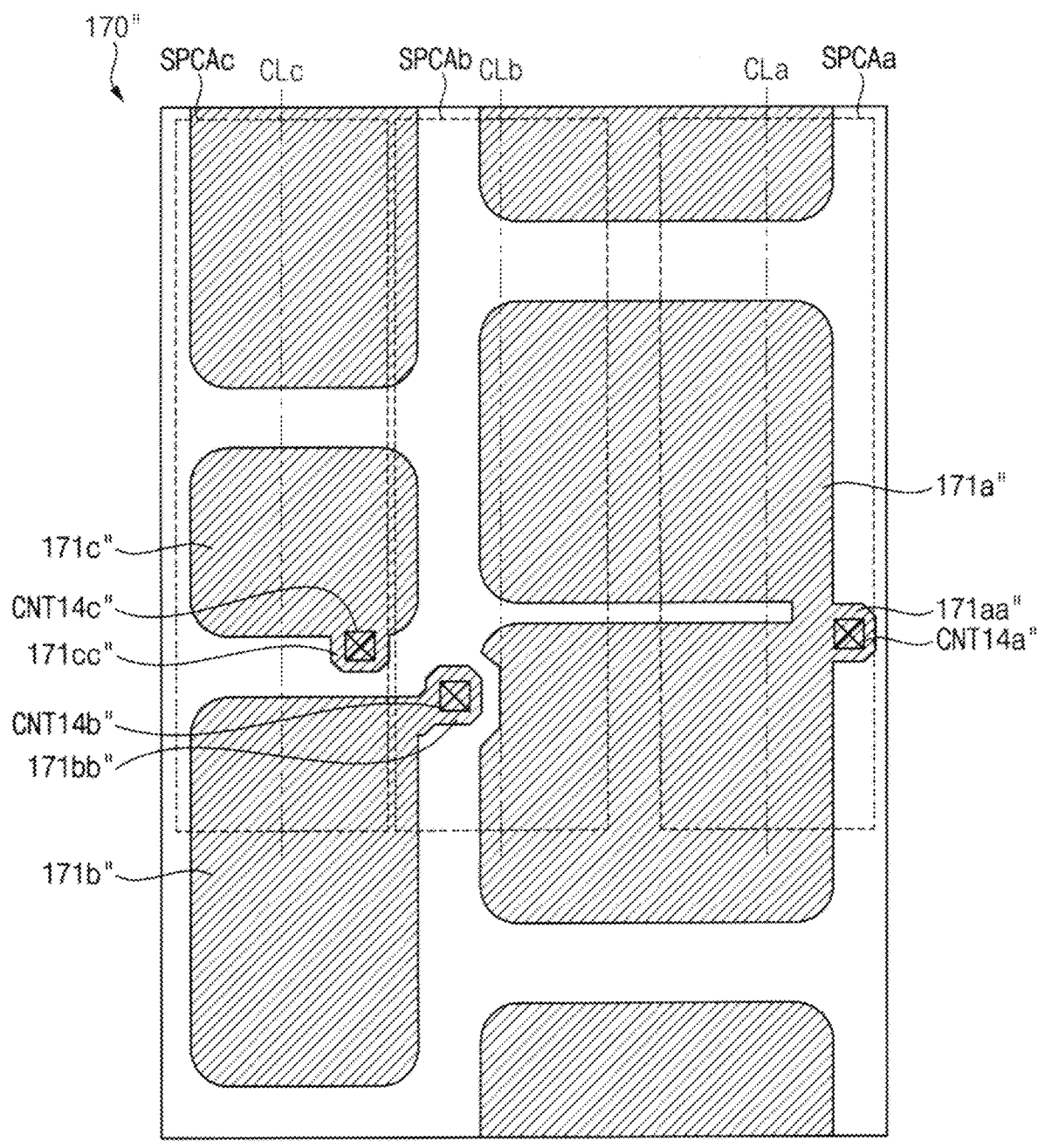
Figure 30:
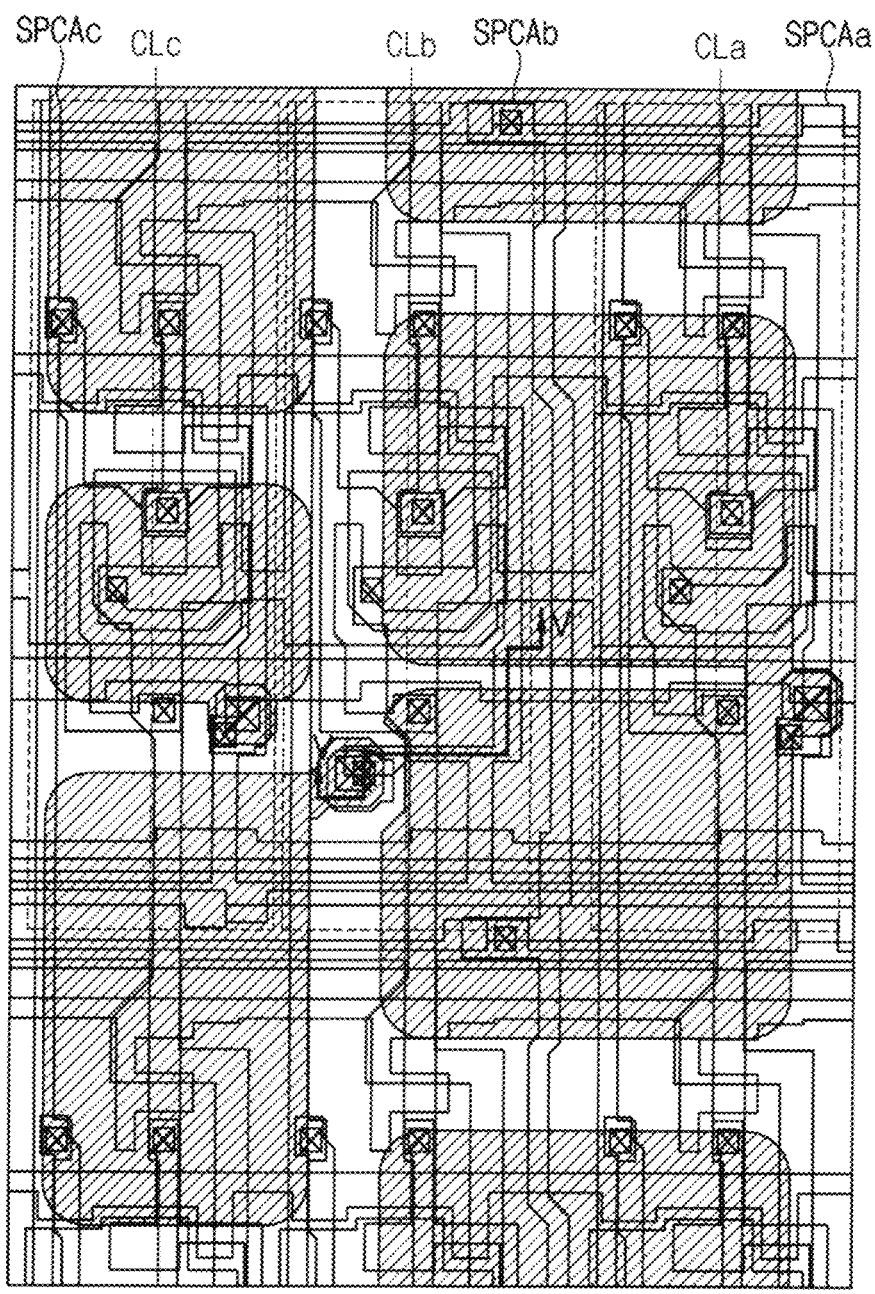
Figure 30:
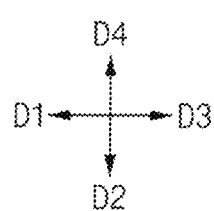

FIGS. 17 to 23 are plan views layers of illustrating a pixel included in a display device according to an alternative embodiment. FIG. 24 is a cross-sectional view taken along line IV-IV' of FIG. 23. Particularly, FIGS. 17, 18, 19, 20, 21, 22, and 23 may correspond to FIGS. 3, 4, 6, 8, 10, 12, and 13 respectively.

Referring to FIGS. 17 to 24, in an alternative embodiment, each of pixels included in a display panel may include an active layer 120', a first conductive layer 130', a second conductive layer 140', a third conductive layer 150', a fourth conductive layer 160', a fifth conductive layer 170', emission layers, and a sixth conductive layer. The first conductive layer 130', the second conductive layer 140', the third conductive layer 150', the fourth conductive layer 160', the fifth conductive layer 170', the emission layers, and the sixth conductive layer may be substantially the same as or similar to the first conductive layer 130, the second conductive layer 140, the fourth conductive layer 160, the fifth conductive layer 170, the light emitting layers and the sixth conductive layer described above with reference to FIGS. 1 to 16, respectively. The same or like elements shown in FIGS. 17 to 24 have been labeled with the same or like reference characters as used above to describe the embodiment of the pixel shown in FIGS. 1 to 16, and any repetitive detailed description thereof will be omitted or simplified.

The active layer 120' may be disposed on the substrate 110. The active layer 120' may include active patterns 121a', 121b', and 121c' respectively disposed in the first to third sub-pixel circuit areas SPCAa, SPCAb, and SPCAc.

The active pattern 121a' disposed in the first sub-pixel circuit area SPCAa may include a first portion 122a'. The first portion 122a' may be a second electrode of a sixth transistor T6a'. As will be described later, the first portion 122a' may be connected to a first electrode 171a' of a first light emitting element LEDa' through a third contact pattern 155a' and a fourth contact pattern 163a'. In an embodiment, the first portion 122a' may be disposed in the first side portion (e.g., the right portion) of the first sub-pixel circuit area SPCAa. In such an embodiment, the first portion 122a' may be positioned in the third direction D3 from the first central line CLa.

The active pattern 121b' disposed in the second sub-pixel circuit area SPCAb may include a first portion 122b', a second portion 123b' positioned in the first direction D1 from the first portion 122b', and a connection portion 124b' connecting the first portion 122b' and the second portion 123b'. The first portion 122b' may be a second electrode of a sixth transistor T6b'. As will be described later, the second portion 123b' may be connected to a first electrode 171b' of a second light emitting element LEDb' through a third contact pattern 155b' and a fourth contact pattern 163b'.

In an embodiment, the first portion 122b' of the active pattern 121b' may be disposed in the first side portion (e.g., the right portion) of the second sub-pixel circuit area SPCAb, and the second portion 123b' may be disposed in the second side portion (e.g., the left portion) of the second sub-pixel circuit area SPCAb. In such an embodiment, the first portion 122b' may be positioned in the third direction D3 from the second central line CLb, and the second portion 123b' may be positioned in the first direction D1 from the second central line CLb. The connection portion 124b' may extend in the first direction D1 and may overlap the second central line CLb.

The active pattern 121c' disposed in the third sub-pixel circuit area SPCAc may include a first portion 122c'. The first portion 122c' may be a second electrode of a sixth transistor T6c'. As will be described later, the first portion 122c' may be connected to a first electrode 171c' of a third light emitting element LEDc' through a third contact pattern 155c' and a fourth contact pattern 163c'. In an embodiment, the first portion 122c' may be disposed in the first side portion (e.g., the right portion) of the third sub-pixel circuit area SPCAc. In such an embodiment, the first portion 122c' may be positioned in the third direction D3 from the third central line CLc.

The first conductive layer 130' and the second conductive layer 140' may be disposed on the active layer 120'.

The third conductive layer 150' may be disposed on the second conductive layer 140'. The third conductive layer 150' may include first connection patterns 151a', 151b', and 151c', second connection patterns 152a' and 152b', first contact patterns 153a', 153b', and 153c', second contact patterns 154a', 154b', and 154c', third contact patterns 155a', 155b', and 155c', a third connection pattern 156c', and gate transmission lines 157', 158', and 159'. The third conductive layer 150' may be substantially the same as or similar to the third conductive layer 150 described with reference to FIGS. 8 and 9 except for the third contact pattern 155b' disposed in the second sub-pixel area SPCAb. Accordingly, any repetitive detailed description thereof will be omitted or simplified.

In an embodiment, the third contact pattern 155a' disposed in the first sub-pixel circuit area SPCAa may be disposed in the first side portion (e.g., the right portion) of the first sub-pixel circuit area SPCAa. In such an embodiment, the third contact pattern 155a' may be positioned in the third direction D3 from the first central line CLa. The third contact pattern 155a' may be connected to the first portion 122a' of the active pattern 121a' through a eighth contact hole CNT8a'. Accordingly, the third contact pattern 155a' may be electrically connected to the sixth transistor T6a'.

In an embodiment, the third contact pattern 155b' disposed in the second sub-pixel circuit area SPCAb may be disposed in the second side portion (e.g., the left portion) of the second sub-pixel circuit area SPCAb. In such an embodiment, the third contact pattern 155b' may be positioned in the first direction D1 from the second central line CLb. The third contact pattern 155b' may be connected to the second portion 123b' of the active pattern 121b' through a eighth contact hole CNT8b'. Accordingly, the third contact pattern 155b' may be electrically connected to the sixth transistor T6b'.

In an embodiment, the third contact pattern 155c' disposed in the third sub-pixel circuit area SPCAc may be disposed in the first side portion (e.g., the right portion) of the third sub-pixel circuit area SPCAc. In such an embodiment, the third contact pattern 155c' may be positioned in the third direction D3 from the third central line CLc. The third contact pattern 155c' may be connected to the first portion 122c' of the active pattern 121c' through a eighth contact hole CNT8c'. Accordingly, the third contact pattern 155c' may be electrically connected to the sixth transistor T6c'.

The third contact pattern 155b' may be disposed to be adjacent to the third contact pattern 155c' rather than the third contact pattern 155a'. A distance between the third contact patterns 155a' and 155b' in the first direction D1 may be greater than a distance between the third contact patterns 155b' and 155c' in the first direction D1.

The fourth conductive layer 160' may be disposed on the third conductive layer 150'. The fourth conductive layer 160' may include driving voltage lines 161a', 161b', and 161c', data lines 162a', 162b', and 162c', fourth contact patterns 163a', 163b', and 163c', and an initialization voltage transmission line 164'. The fourth conductive layer 160' may be substantially the same as or similar to the fourth conductive layer 160 described with reference to FIGS. 10 and 11. Accordingly, any repetitive detailed description thereof will be omitted or simplified.

The driving voltage line 161b' disposed in the second sub-pixel circuit area SPCAb may overlap the second central line CLb. The driving voltage line 161b' may overlap the connection portion 124b' of the active pattern 121b'. In such an embodiment, the first portion 122b' and the second portion 123b' of the active pattern 121b' may be spaced apart from each other with the driving voltage line 161b' interposed therebetween in a plan view.

The fifth conductive layer 170' may be disposed on the fourth conductive layer 160'. The fifth conductive layer 170' may include first electrodes 171a', 171b', and 171c' that are spaced apart from each other. The first electrode 171a' may include a contact portion 171aa' overlapping the fourth contact pattern 163a'. The contact portion 171aa' may be positioned in the third direction D3 from the first central line CLa. The first electrode 171b' may include a contact portion 171bb' overlapping the fourth contact pattern 163b'. The contact portion 171bb' may be positioned in the first direction D1 from the second central line CLb. The first electrode 171c' may include a contact portion 171cc' overlapping the fourth contact pattern 163c'. The contact portion 171cc' may be positioned in the third direction D3 from the third central line CLc.

The emission layers and the sixth conductive layer may be disposed on the fifth conductive layer 170'.

According to embodiments of the invention, the second portion 123b' of the active pattern 121b' may be disposed in the second side portion (e.g., the left portion) of the second sub-pixel circuit area SPCAb. Accordingly, the third contact pattern 155b', the fourth contact pattern 163b' and the contact portion 171bb' of the first electrode 171b' may be disposed in the second side portion of the second sub-pixel circuit area SPCAb. Accordingly, even if the first electrode 171a' has a relatively great area, first to third sub-pixel circuits SPCa', SPCb', and SPCc' may be relatively uniformly disposed while the first electrodes 171a', 171b', and 171c' are spaced apart from each other. Accordingly, the image quality characteristic of each pixel may be improved, and a display quality of the display device may be improved.

Figure 31:
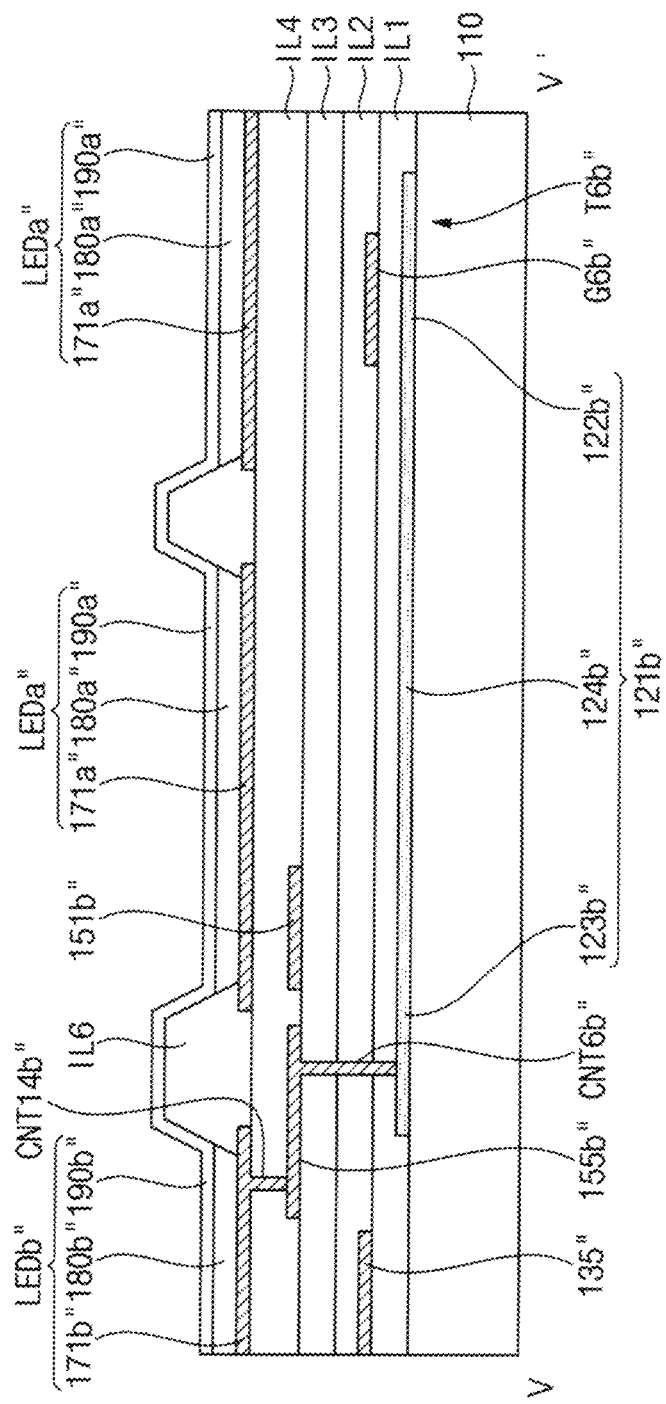
FIG. 31 is a cross-sectional view taken along line V-V of FIG. 30.

FIGS. 25 to 30 are plan views layers of illustrating a pixel included in a display device according to another alternative embodiment. FIG. 31 is a cross-sectional view taken along line V-V of FIG. 30. Particularly, FIGS. 25, 26, 27, 28, 29, and 30 may correspond to FIGS. 17, 18, 19, 20, 22, and 23 respectively.

Referring to FIGS. 25 to 31, in another alternative embodiment, each of pixels included in a display panel may include an active layer 120", a first conductive layer 130", a second conductive layer 140", a third conductive layer 150", a fifth conductive layer 170", emission layers, and a sixth conductive layer. The active layer 120", the first conductive layer 130", the second conductive layer 140", the fifth conductive layer 170", the emission layers, and the sixth conductive layer may be substantially the same as or similar to the active layer 120', the first conductive layer 130', the second conductive layer 140', the fifth conductive layer 170', the light emitting layers and the sixth conductive layer described with reference to FIGS. 17 to 24, respectively. The same or like elements shown in FIGS. 25 to 31 have been labeled with the same or like reference characters as used above to describe the embodiment of the pixel shown in FIGS. 17 to 24, and any repetitive detailed description thereof will be omitted or simplified.

The active pattern 120", the first conductive layer 130", and the second conductive layer 140" may be disposed on the substrate 100.

The third conductive layer 150" may be disposed on the second conductive layer 140". The third conductive layer 150" may include driving voltage lines 151a", 151b", and 151c", data lines 152a", 152b", and 152c", connection patterns 153a", 153b", and 153c", contact patterns 154a", 154b", and 154c", and an initialization voltage transmission line 155".

The driving voltage line 151a" may extend in the second direction D2. The driving voltage line 151a" may overlap the first central line CLa. The first power voltage ELVDD may be applied to the driving voltage line 151a". The driving voltage line 151a" may transfer the first power voltage ELVDD to a first sub-pixel circuit SPCa". The driving voltage line 151a" may be connected to an active pattern 121a" through a first contact hole CNT1a", and may be connected to a second conductive pattern 141a" through a second contact hole CNT2a". Accordingly, the driving voltage line 151a" may be electrically connected to a fifth transistor T5a" and a storage capacitor CSTa". The driving voltage lines 151b" and 151c" may be substantially the same as or similar to the driving voltage line 151a".

The data line 152a" may extend in the second direction D2. The data line 152a" may be spaced apart from the driving voltage line 151a" in the first direction D1. The data voltage VDATA may be applied to the data line 152a". The data line 152a" may be connected to an active pattern 121a" through a third contact hole CNT3a". Accordingly, the data line 152a" may be electrically connected to a second transistor T2a". The data lines 162b" and 162c" may be substantially the same as or similar to the data line 162a".

The connection pattern 153a" may be connected to the active pattern 121a" through a fourth contact hole CNT4a", and may be connected to a first conductive pattern 131a" through a fifth contact hole CNT5a". Accordingly, the first connection pattern 151a" may connect the active pattern 121a" and the first conductive pattern 131a". The storage capacitor CSTa" may be electrically connected to a fourth transistor T4a" by the connection pattern 153a". The connection patterns 153b" and 153c" may be substantially the same as or similar to the connection pattern 153a".

In an embodiment, the contact pattern 154a" disposed in the first sub-pixel circuit area SPCAa may be spaced apart from the driving voltage line 151a" in the third direction D3. In such an embodiment, the contact pattern 154a" may be disposed in the first side portion (e.g., the right portion) of the first sub-pixel circuit area SPCAa. The contact pattern 154a" may be positioned in the third direction D3 from the first central line CLa. The contact pattern 154a" may be connected to a first portion 122a" of the active pattern 121a" through a sixth contact hole CNT6a". Accordingly, the contact pattern 154a" may be electrically connected to a sixth transistor T6a".

In an embodiment, the contact pattern 154b" disposed in the second sub-pixel circuit area SPCAb may be spaced apart from the driving voltage line 151b" in the first direction D1. In such an embodiment, the contact pattern 154b" may be disposed in the second side portion (e.g., the left portion) of the second sub-pixel circuit area SPCAb. The contact pattern 154b" may be positioned in the first direction D1 from the second central line CLb. The contact pattern 154b" may be connected to a second portion 123b" of the active pattern 121b" through a sixth contact hole CNT6b". Accordingly, the contact pattern 154b" may be electrically connected to a sixth transistor T6b". The contact pattern 154b" may overlap the second portion 123b" of the active pattern 121b" and may not overlap a first portion 122b" of the active pattern 121b".

In an embodiment, the contact pattern 154c" disposed in the third sub-pixel circuit area SPCAc may be spaced apart from the driving voltage line 151c" in the third direction D3. In such an embodiment, the contact pattern 154c" may be disposed in the first side portion (e.g., the right portion) of the third sub-pixel circuit area SPCAc. The contact pattern 154c" may be positioned in the third direction D3 from the third central line CLc. The contact pattern 154c" may be connected to a first portion 122c" of the active pattern 121c" through a sixth contact hole CNT6c". Accordingly, the contact pattern 154c" may be electrically connected to a sixth transistor T6c".

The contact pattern 154b" may be disposed to be adjacent to the contact pattern 154c" rather than the contact pattern 154a". A distance between the contact patterns 154a" and 154b" in the first direction D1 may be greater than a distance between the contact patterns 154b" and 154c" in the first direction D1.

The fifth conductive layer 170" may be disposed on the third conductive layer 150". The fifth conductive layer 170" may include first electrodes 171a", 171b", and 171c" that are spaced apart from each other. The first electrode 171a" may include a contact portion 171aa" overlapping the contact pattern 154a". The contact portion 171aa" may be positioned in the third direction D3 from the first central line CLa. The first electrode 171b" may include a contact portion 171bb" overlapping the contact pattern 154b". The contact portion 171bb" may be positioned in the first direction D1 from the second central line CLb. The first electrode 171c" may include a contact portion 171cc" overlapping the contact pattern 154c". The contact portion 171cc" may be positioned in the third direction D3 from the third central line CLc.

According to an embodiment, a conductive layer may not be disposed between the third conductive layer 150" and the fifth conductive layer 170". In such an embodiment, the second portion 123b" of the active pattern 121b" may be disposed in the second side portion (e.g., the left portion) of the second sub-pixel circuit area SPCAb. Accordingly, the contact pattern 155b" and the contact portion 171bb" of the first electrode 171b" may be disposed in the second side portion of the second sub-pixel circuit area SPCAb. In such an embodiment, even if the first electrode 171a" has a relatively great area, first to third sub-pixel circuits SPCa", SPCb", and SPCc" may be relatively uniformly disposed while the first electrodes 171a", 171b", and 171c" are spaced apart from each other. Accordingly, the image quality characteristic of each pixel may be improved, and a display quality of the display device may be improved.

Figure 32:
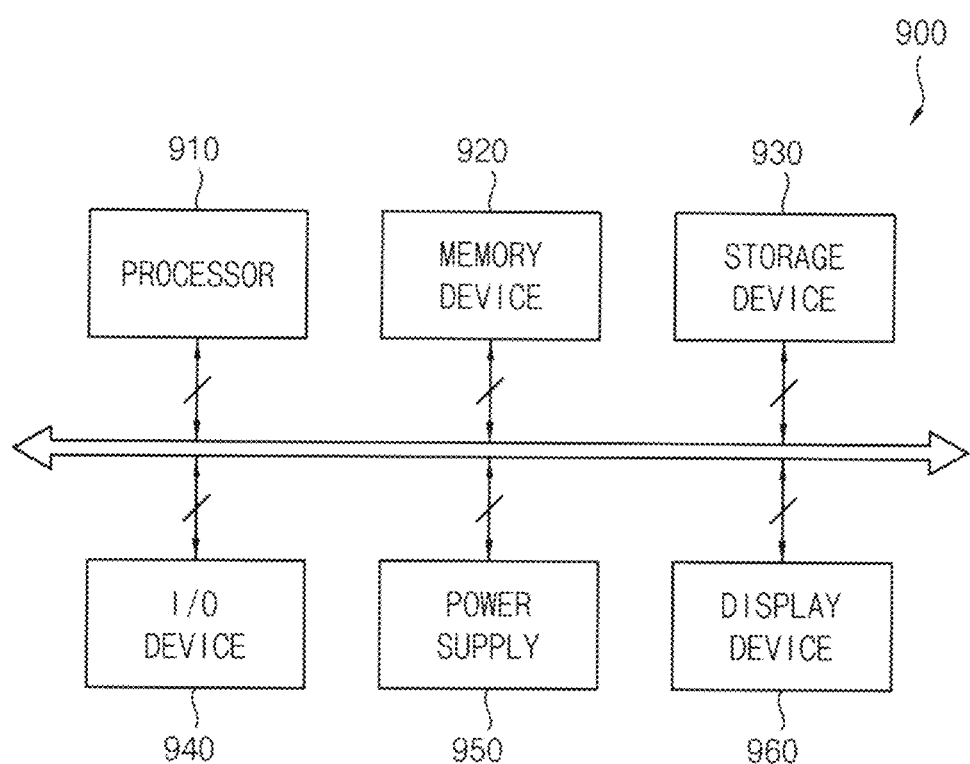
FIG. 32 is a block diagram illustrating an electronic device according to an embodiment.
Figure 33:
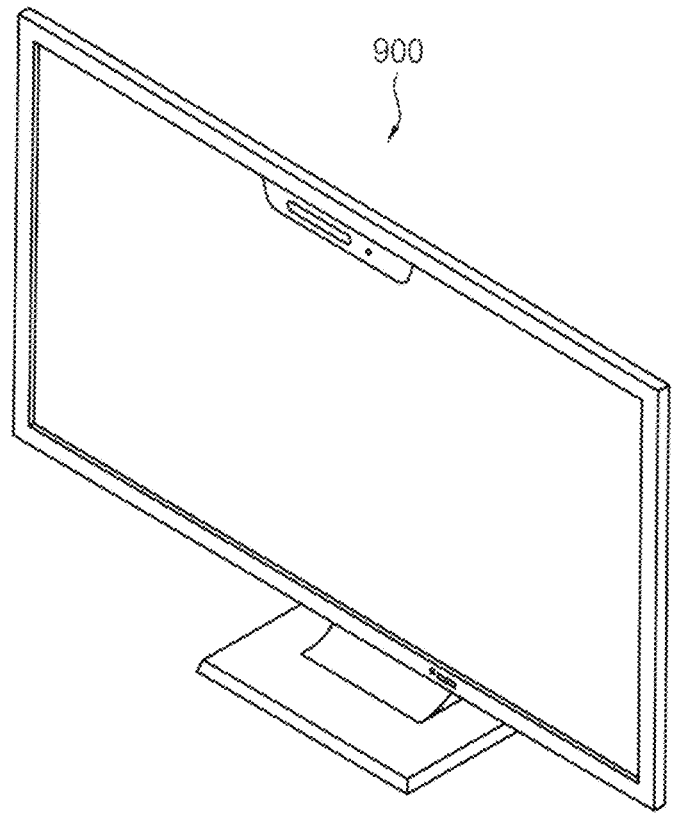
FIG. 33 is a diagram illustrating an embodiment in which the electronic device of FIG. 32 is implemented as a television.
Figure 34:
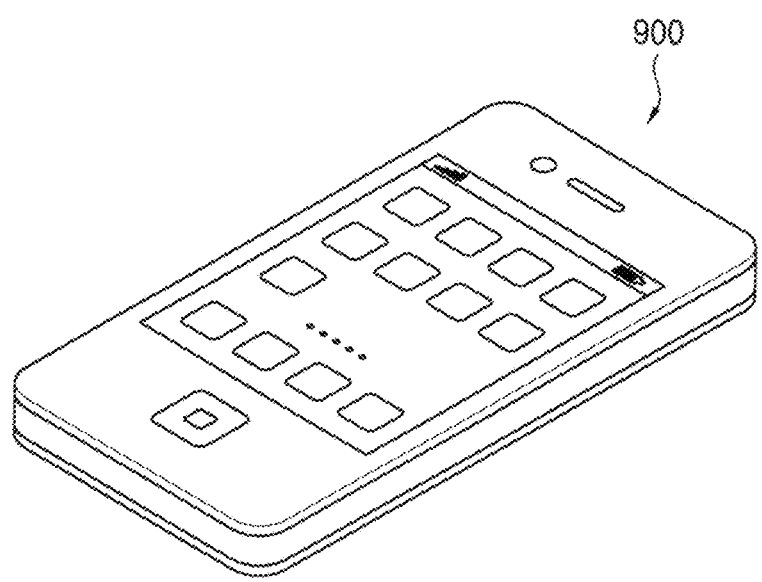
FIG. 34 is a diagram illustrating an embodiment in which the electronic device of FIG. 32 is implemented as a smart phone.

FIG. 32 is a block diagram illustrating an electronic device according to an embodiment. FIG. 33 is a diagram illustrating an embodiment in which the electronic device of FIG. 32 is implemented as a television. FIG. 34 is a diagram illustrating an embodiment in which the electronic device of FIG. 32 is implemented as a smart phone.

Referring to FIGS. 32 to 34, in an embodiment, an electronic device 900 may include a processor 910, a memory device 920, a storage device 930, an input/output ("I/O") device 940, a power supply 950, and a display device 960. Here, the display device 960 may correspond to an embodiment of the display device described above with reference to FIGS. 1 to 16, an embodiment of the display device described above with reference to FIGS. 17 to 24, or an embodiment of the display device described above with reference to FIGS. 25 to 31. The electronic device 900 may further include a plurality of ports for communicating with a video card, a sound card, a memory card, a universal serial bus ("USB") device, or the like. In an embodiment, as illustrated in FIG. 33, the electronic device 900 may be implemented as a television. In another embodiment, as illustrated in FIG. 34, the electronic device 900 may be implemented as a smart phone. However, embodiments are not limited thereto, in an alternative embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. In an embodiment, the processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

In an embodiment, the storage device 930 may include a solid state drive ("SSD") device, a hard disk drive ("HDD") device, a CD-ROM device, or the like. In an embodiment, the I/O device 940 may include an input device such as a keyboard, a keypad, a mouse device, a touchpad, a touchscreen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
   a substrate;
   a first sub-pixel circuit disposed on the substrate;
   a second sub-pixel circuit disposed on the substrate and positioned in a first direction from the first sub-pixel circuit;
   a first driving voltage line disposed on the substrate and extending in a second direction crossing the first direction, wherein the first driving voltage line transmits a driving voltage to the first sub-pixel circuit;
   a second driving voltage line disposed on the substrate and extending in the second direction, wherein the second driving voltage line transmits the driving voltage to the second sub-pixel circuit;
   a first anode electrode disposed on the substrate and including a first contact portion electrically connected to the first sub-pixel circuit, wherein the first contact portion is positioned in a third direction opposite to the first direction from the first driving voltage line; and
   a second anode electrode disposed on the substrate and including a second contact portion electrically connected to the second sub-pixel circuit, wherein the second contact portion is positioned in the first direction from the second driving voltage line.

2. The display panel of claim 1, wherein the second anode electrode is spaced apart from the first anode electrode in the first direction.

3. The display panel of claim 1, wherein an area of the first anode electrode is greater than an area of the second anode electrode.

4. The display panel of claim 1, wherein the second contact portion is adjacent to the first anode electrode.

5. The display panel of claim 1, wherein a distance between the first contact portion and the second contact portion in the first direction is greater than a distance between the first driving voltage line and the second driving voltage line in the first direction.

6. The display panel of claim 1, wherein
the first sub-pixel circuit includes a first driving transistor which receives the driving voltage from the first driving voltage line, and a first emission control transistor electrically connected to the first driving transistor and the first anode electrode,
the second sub-pixel circuit includes a second driving transistor which receives the driving voltage from the second driving voltage line, and a second emission control transistor electrically connected to the second driving transistor and the second anode electrode,
the display panel further comprises:
a first active pattern disposed on the substrate and including a channel portion of the first emission control transistor; and
a second active pattern disposed in a same layer as the first active pattern, positioned in the first direction from the first active pattern, and including a channel portion of the second emission control transistor, and
the channel portion of the first emission control transistor is positioned in the third direction from the first driving voltage line, and
the channel portion of the second emission control transistor is positioned in the third direction from the second driving voltage line.

7. The display panel of claim 6, further comprising:
a first lower contact pattern disposed between the first active pattern and the first anode electrode, electrically connecting the first active pattern and the first contact portion to each other, and positioned in the third direction from the first driving voltage line; and
a second lower contact pattern disposed in a same layer as the first lower contact pattern, electrically connecting the second active pattern and the second contact portion to each other, and overlapping the second driving voltage line.

8. The display panel of claim 7, wherein the second lower contact pattern includes:
a first end portion positioned in the third direction from the second driving voltage line and electrically connected to the second active pattern;
a second end portion positioned in the first direction from the second driving voltage line and electrically connected to the second contact portion; and
a connection portion connecting the first end portion and the second end portion to each other and overlapping the second driving voltage line.

9. The display panel of claim 7, further comprising:
a first upper contact pattern disposed between the first lower contact pattern and the first anode electrode, electrically connecting the first lower contact pattern and the first contact portion to each other, and positioned in the third direction from the first driving voltage line; and
a second upper contact pattern disposed in a same layer as the first upper contact pattern, electrically connecting the second lower contact pattern and the second contact portion to each other, and positioned in the first direction from the second driving voltage line.

10. The display panel of claim 6, wherein the second active pattern includes:
a first portion positioned in the third direction from the second driving voltage line and adjacent to the channel portion of the second emission control transistor;
a second portion positioned in the first direction from the second driving voltage line and electrically connected to the second contact portion; and
a connection portion connecting the first portion and the second portion and overlapping the second driving voltage line.

11. The display panel of claim 10, further comprising:
a first contact pattern disposed between the first active pattern and the first anode electrode, electrically connecting the first active pattern and the first contact portion to each other, and positioned in the third direction from the first driving voltage line; and
a second contact pattern disposed in a same layer as the first contact pattern, electrically connecting the second active pattern and the second contact portion to each other, and positioned in the first direction from the second driving voltage line.

12. The display panel of claim 1, further comprising:
a third sub-pixel circuit disposed on the substrate and positioned in the first direction from the second sub-pixel circuit;
a third driving voltage line disposed on the substrate and extending in the second direction, wherein the third driving voltage line transmits the driving voltage to the third sub-pixel circuit; and
a third anode electrode disposed on the substrate and including a third contact portion electrically connected to the third sub-pixel circuit, wherein the third contact portion is positioned in the third direction from the third driving voltage line.

13. The display panel of claim 12, wherein a first light emitting element including the first anode electrode, a second light emitting element including the second anode electrode, and a third light emitting element including the third anode electrode respectively emit light of different colors.

14. The display panel of claim 12, wherein
the first anode electrode is spaced apart from the third anode electrode in the third direction, and
the second anode electrode is spaced apart from the third anode electrode in the second direction.

15. The display panel of claim 12, wherein an area of the first anode electrode is greater than each of an area of the second anode electrode and an area of the third anode electrode.

16. The display panel of claim 12, wherein a distance between the first contact portion and the second contact portion in the first direction is greater than a distance between the second contact portion and the third contact portion in the first direction.

17. A display panel comprising:
a substrate including a first area and a second area positioned in a first direction from the first area;
a first sub-pixel circuit disposed in the first area on the substrate;
a second sub-pixel circuit disposed in the second area on the substrate;
a first anode electrode disposed on the substrate and including a first contact portion electrically connected to the first sub-pixel circuit, wherein a first imaginary central line extending in a second direction perpendicular to the first direction through a center of the first area is defined, and the first contact portion is positioned in a third direction opposite to the first direction from the first imaginary central line; and a second anode electrode disposed on the substrate and including a second contact portion electrically connected to the second sub-pixel circuit, wherein a second imaginary central line extending in the second direction through a center of the second area is defined, and the second contact portion is positioned in the first direction from the second imaginary central line.

18. The display panel of claim 17, wherein an area of the first anode electrode is greater than an area of the second anode electrode.

19. The display panel of claim 17, wherein a distance between the first contact portion and the second contact portion in the first direction is greater than a distance between the first imaginary central line and the second imaginary central line in the first direction.

20. The display panel of claim 17, wherein the substrate further includes a third area positioned in the first direction from the second area, and the display panel further comprises:

a third sub-pixel circuit disposed in the third area on the substrate; and a third anode electrode disposed on the substrate and including a third contact portion electrically connected to the third sub-pixel circuit, wherein a third imaginary central line extending in the second direction through a center of the third area is defined, and the third contact portion is positioned in the third direction from the third imaginary central line.

\* \* \* \* \*